US010651160B2

(12) United States Patent
Kang et al.

(10) Patent No.: US 10,651,160 B2
(45) Date of Patent: May 12, 2020

(54) LOW PROFILE INTEGRATED PACKAGE

(71) Applicant: QUALCOMM Incorporated, San Diego, CA (US)

(72) Inventors: Kuiwon Kang, San Diego, CA (US); Houssam Jomaa, San Diego, CA (US); Christopher Bahr, San Diego, CA (US); Layal Rouhana, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/867,518

(22) Filed: Jan. 10, 2018

(65) Prior Publication Data
US 2018/0269186 A1 Sep. 20, 2018

Related U.S. Application Data

(60) Provisional application No. 62/473,938, filed on Mar. 20, 2017.

(51) Int. Cl.
*H01L 21/48* (2006.01)
*H01L 23/49* (2006.01)
(Continued)

(52) U.S. Cl.
CPC .......... *H01L 25/10* (2013.01); *H01L 21/4803* (2013.01); *H01L 21/486* (2013.01);
(Continued)

(58) Field of Classification Search
CPC . H01L 25/10; H01L 21/4803; H01L 21/4853; H01L 21/4857; H01L 21/486;
(Continued)

(56) References Cited

U.S. PATENT DOCUMENTS 6,946,329 B2 9/2005 Pierson et al.
9,418,926 B1 8/2016 Fay et al.
(Continued)

FOREIGN PATENT DOCUMENTS

EP 2110849 A2 10/2009
WO 2006042029 A2 4/2006

OTHER PUBLICATIONS

International Search Report and Written Opinion—PCT/US2018/020918—ISA/EPO—dated May 25, 2018.

*Primary Examiner* — Didarul A Mazumder
(74) *Attorney, Agent, or Firm* — Loza & Loza, LLP/Qualcomm

(57) ABSTRACT

A package that includes a substrate comprising an interposer interconnect and a cavity, a redistribution portion coupled to the substrate, the redistribution comprising a plurality of redistribution interconnects, and a first die coupled to the redistribution portion through the cavity of the substrate. A substantial region between a side surface of the first die and the substrate is free of an encapsulation layer. In some implementations, the substrate is free of a metal ring that surrounds the first die. In some implementations, the redistribution portion comprises a barrier layer and a first interconnect coupled to the barrier layer. The barrier layer is coupled to the interposer interconnect.

29 Claims, 20 Drawing Sheets

(51) Int. Cl.
*H01L 23/538* (2006.01)
*H01L 23/31* (2006.01)
*H01L 25/10* (2006.01)
*H01L 23/498* (2006.01)
*H01L 23/00* (2006.01)

(52) U.S. Cl.
CPC ...... *H01L 21/4853* (2013.01); *H01L 21/4857* (2013.01); *H01L 23/49816* (2013.01); *H01L 23/49822* (2013.01); *H01L 23/5383* (2013.01); *H01L 23/5384* (2013.01); *H01L 23/5389* (2013.01); *H01L 24/16* (2013.01); *H01L 23/3128* (2013.01); *H01L 23/49827* (2013.01); *H01L 2224/16227* (2013.01); *H01L 2224/16237* (2013.01); *H01L 2225/1035* (2013.01); *H01L 2225/1041* (2013.01); *H01L 2225/1088* (2013.01); *H01L 2924/15153* (2013.01)

(58) Field of Classification Search
CPC ......... H01L 23/49816; H01L 23/49822; H01L 23/5383; H01L 23/5384; H01L 23/5389; H01L 24/16; H01L 23/49827; H01L 2224/16227; H01L 2224/16237; H01L 2225/1035; H01L 2225/1041; H01L 2225/1088; H01L 2924/15153
USPC ........ 257/774; 438/629, 637, 639, 640, 667, 438/668, 672, 675, 700, 701, 713, 978
See application file for complete search history.

(56) References Cited

U.S. PATENT DOCUMENTS

| | | | |
|---|---|---|---|
| 9,666,521 | B2 | 5/2017 | Uzoh et al. |
| 2010/0237483 | A1* | 9/2010 | Chi ................... H01L 21/565 257/686 |
| 2011/0115074 | A1 | 5/2011 | Hu et al. |
| 2013/0069224 | A1* | 3/2013 | Kim ................ H01L 23/49827 257/737 |
| 2014/0061920 | A1 | 3/2014 | Hirano et al. |
| 2014/0246227 | A1* | 9/2014 | Lin .................... H01L 21/4857 174/266 |
| 2015/0062420 | A1* | 3/2015 | Borthakur ........... H04N 5/2253 348/373 |
| 2015/0228556 | A1 | 8/2015 | Lee et al. |
| 2016/0190056 | A1 | 6/2016 | Park et al. |
| 2017/0077053 | A1 | 3/2017 | Keser et al. |

* cited by examiner

LOW PROFILE INTEGRATED PACKAGE

CROSS REFERENCE TO RELATED APPLICATION

This application claims priority to and the benefit of Provisional Application No. 62/473,938 filed on Mar. 20, 2017 in the U.S. Patent and Trademark Office, the entire contents of which is incorporated herein by reference.

BACKGROUND

Field of the Disclosure

Various features relate generally to an integrated package, and more specifically to a low profile integrated package.

Background

FIG. 1 illustrates a package on package (PoP) device 100 that includes a first package 102 and a second package 104. The first package 102 includes a first die 120, a first package substrate 122 and a first encapsulation layer 129. The first package substrate 122 includes a first plurality of pads 124 and a first pad 126. The first die 120 is coupled to the first package substrate 122 through a first plurality of solder balls 128. Specifically, the first die 120 is coupled to the first plurality of pads 124 through the first plurality of solder balls 128. The encapsulation layer 129 encapsulates the first die 120 and the first plurality of solder balls 128. A second plurality of solder balls 130 is coupled to the first package substrate 122.

The second package 104 includes a second die 140, a second package substrate 142, a second pad 146, a wire bond 148, and a second encapsulation layer 160. The second die 140 is coupled to the second package substrate 142. The wire bond 148 is coupled to the second die 140 and a pad of the second package substrate 142. The second package substrate 142 is needed in order to provide structural support for the second package 104, as well as providing a base for the second die 140, and to provide an electrical path to the first package 102.

The second package 104 is coupled to the first package 102 through a third solder ball 156. For example, the third solder ball 156 is coupled to the first pad 126 of the first package substrate 122, and the second pad 146 of the second package 104.

Each package has a height of about 500 microns (μm) or greater. The combined height (e.g., Z-height) of the package on package (PoP) device 100 is greater 1000 microns (μm). That is, the height between the top of the package on package (PoP) device 100 (e.g., top of the second encapsulation layer 160) and the bottom of the package on package (PoP) device 100 (e.g., bottom of the second plurality of solder balls 130) is greater than 1000 microns (μm).

There is an ongoing industry trend to reduce the height of packages, as these packages are placed in smaller and smaller devices. Ideally, such a package will have a better form factor, be cheaper to fabricate, while at the same time meeting the needs and/or requirements of mobile and/or wearable devices.

SUMMARY

Various features relate generally to an integrated package, and more specifically to a low profile integrated package.

One example provides a package that includes a substrate comprising an interposer interconnect and a cavity, a redistribution portion coupled to the substrate, the redistribution comprising a plurality of redistribution interconnects, and a first die coupled to the redistribution portion through the cavity of the substrate. A substantial region between a side surface of the first die and the substrate is free of an encapsulation layer.

Another example provides a package that includes a substrate comprising an interposer interconnect and a cavity, a redistribution portion coupled to the substrate, the redistribution comprising a plurality of redistribution interconnects and a barrier layer, wherein the barrier layer is coupled to the interposer interconnect. The package includes a first die coupled to the redistribution portion through the cavity of the substrate.

Another example provides an apparatus that includes means for substrate comprising an interposer interconnect and a cavity, means for redistribution coupled to the means for substrate, the means for redistribution comprising a plurality of redistribution interconnects, and a first die coupled to the means for redistribution through the cavity of the means for substrate. A substantial region between a side surface of the first die and the means for substrate is free of an encapsulation layer.

Another example provides a package that includes a substrate comprising an interposer interconnect and a cavity, a redistribution portion coupled to the substrate, the redistribution comprising a plurality of redistribution interconnects and a barrier layer, wherein the barrier layer is coupled to the interposer interconnect. The package includes a first die coupled to the redistribution portion through the cavity of the substrate.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

Figure 1:
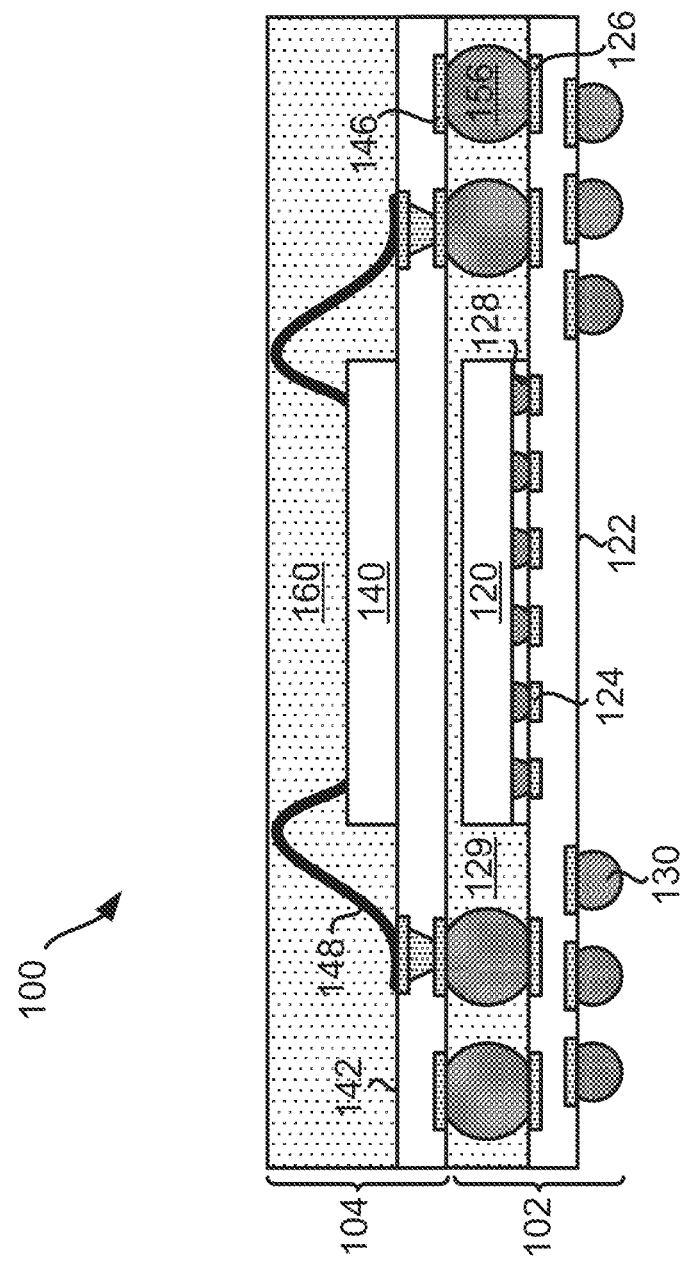
FIG. 1 illustrates a cross-sectional view of a package on package (PoP) device.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Some features pertain to a device package (e.g., an integrated package, an integrated circuit (IC) package) that includes a substrate comprising an interposer interconnect and a cavity, a redistribution portion coupled to the substrate, the redistribution comprising a plurality of redistribution interconnects, and a first die coupled to the redistribution portion through the cavity of the substrate. A substantial region between a side surface of the first die and the substrate is free of an encapsulation layer. In some implementations, a substantial area of a side surface of the first die is free of an encapsulation layer. In some implementations, the substrate is free of a metal ring that surrounds the first die. In some implementations, the integrated package (e.g., integrated circuit (IC) package) comprises a thickness in a range of about 200-300 microns (μm). In some implementations, the redistribution portion comprises a barrier layer and a first interconnect coupled to the barrier layer. The barrier layer is coupled to the interposer interconnect. In some implementations, the integrated package includes a backside redistribution portion.

In some implementations, the height of the device package may be defined along the Z-direction of the device package, which is shown in the figures of the present disclosure. In some implementations, the Z-direction of the device package may be defined along an axis between a top portion and a bottom portion of the device package. The terms top and bottom may be arbitrarily assigned, however as an example, the top portion of the device package may be a portion comprising a die or a backside redistribution portion, while a bottom portion of the device package may be a portion comprising a redistribution portion or a plurality of solder balls. In some implementations, the top portion of the device package may be a back side of the device package, and the bottom portion of the device package may be a front side of the device package. The front side of the device package may be an active side of the device package. A top portion may be a higher portion relative to a lower portion. A bottom portion may be a lower portion relative to a higher portion. Further examples of top portions and bottom portions will be further described below. The X-Y directions of the device package may refer to the lateral direction and/or footprint of the device package. Examples of X-Y directions are shown in the figures of the present disclosure and/or further described below. In many of the figures of the present disclosure, the device packages and their respective components are shown across a X-Z cross-section or X-Z plane. However, in some implementations, the device packages and their representative components may be represented across a Y-Z cross-section or Y-Z plane.

In some implementations, an interconnect is an element or component of a device or package that allows or facilitates an electrical connection between two points, elements and/ or components. In some implementations, an interconnect may include a trace, a via, a pad, a pillar, a redistribution metal layer, a barrier layer, and/or an under bump metallization (UBM) layer. In some implementations, an interconnect is an electrically conductive material that may provide an electrical path for a signal (e.g., data signal, ground signal, power signal). An interconnect may be part of a circuit. An interconnect may include more than one element or component.

Exemplary Low Profile Package

Figure 2:
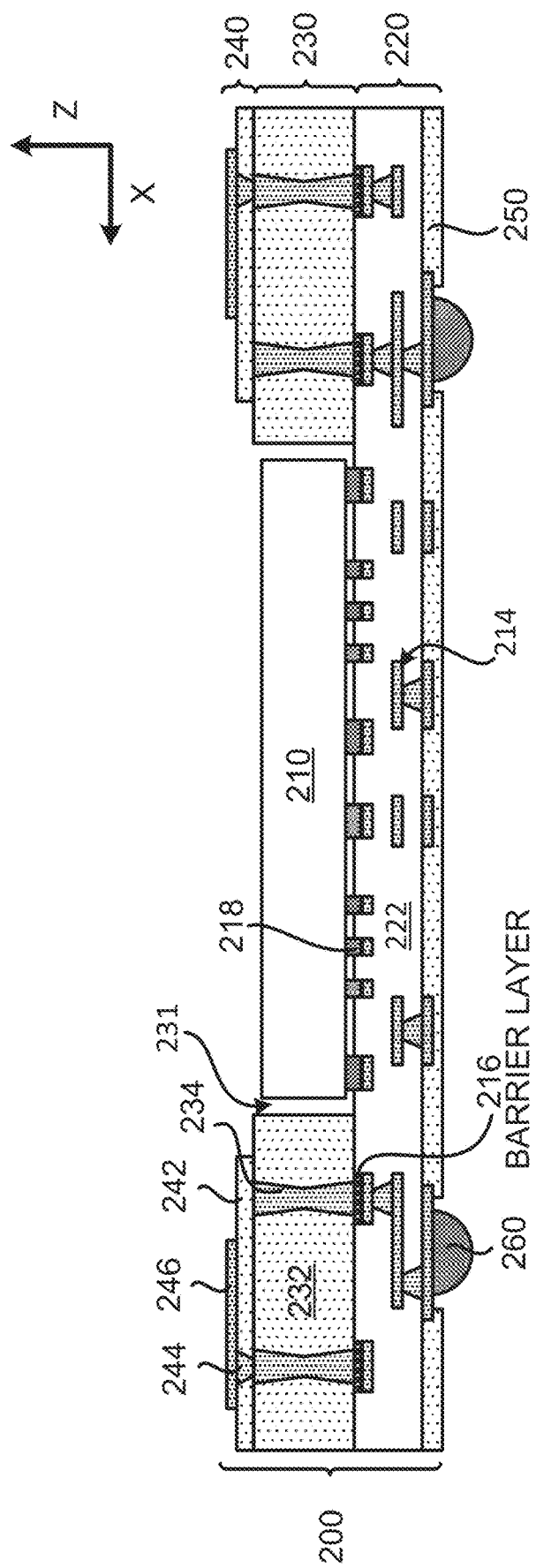
FIG. 2 illustrates a cross-sectional view of an example of a low profile package that includes a die, an interposer and a redistribution portion.

FIG. 2 illustrates a package 200 that is a low profile package. The package 200 may be an integrated package (e.g., an integrated circuit (IC) package). The package 200 may be a bottom package of a package on package (PoP) device. The package 200 has a height (e.g., Z-height) that is less than other packages. In some implementations, the height of the package 200 is in a range of about 200-300 microns (μm). In contrast, the height of other known comparable packages may be about 500 microns (μm) or greater. The term comparable package means a package that has a comparable or similar footprint or surface area and functionality, as another package. Thus, the package 200 of FIG. 2 provides a package that has a lower height profile than other comparable packages.

As shown in FIG. 2, the package 200 includes a first die 210, a redistribution portion 220, an interposer 230, and a backside redistribution portion 240. The first die 210 is coupled to a first surface of the redistribution portion 220. The first die 210 includes a plurality of interconnects 218 that is coupled to the redistribution portion 220. The plurality of interconnects 218 may include pillars and/or solder. A first surface of the interposer 230 is coupled to the first surface the redistribution portion 220. The backside redistribution portion 240 is coupled to a second surface of the interposer 230. The interposer 230 includes a cavity 231. The first die 210 is located in the cavity 231 of the interposer 230 such that the interposer 230 laterally surrounds the first die 210. The interposer 230 may be a means for interposer that includes one or more interposer interconnects (e.g., vias). The interposer 230 may be a form of a substrate (e.g., means for substrate) that includes one or more interposer interconnects.

Figure 3:
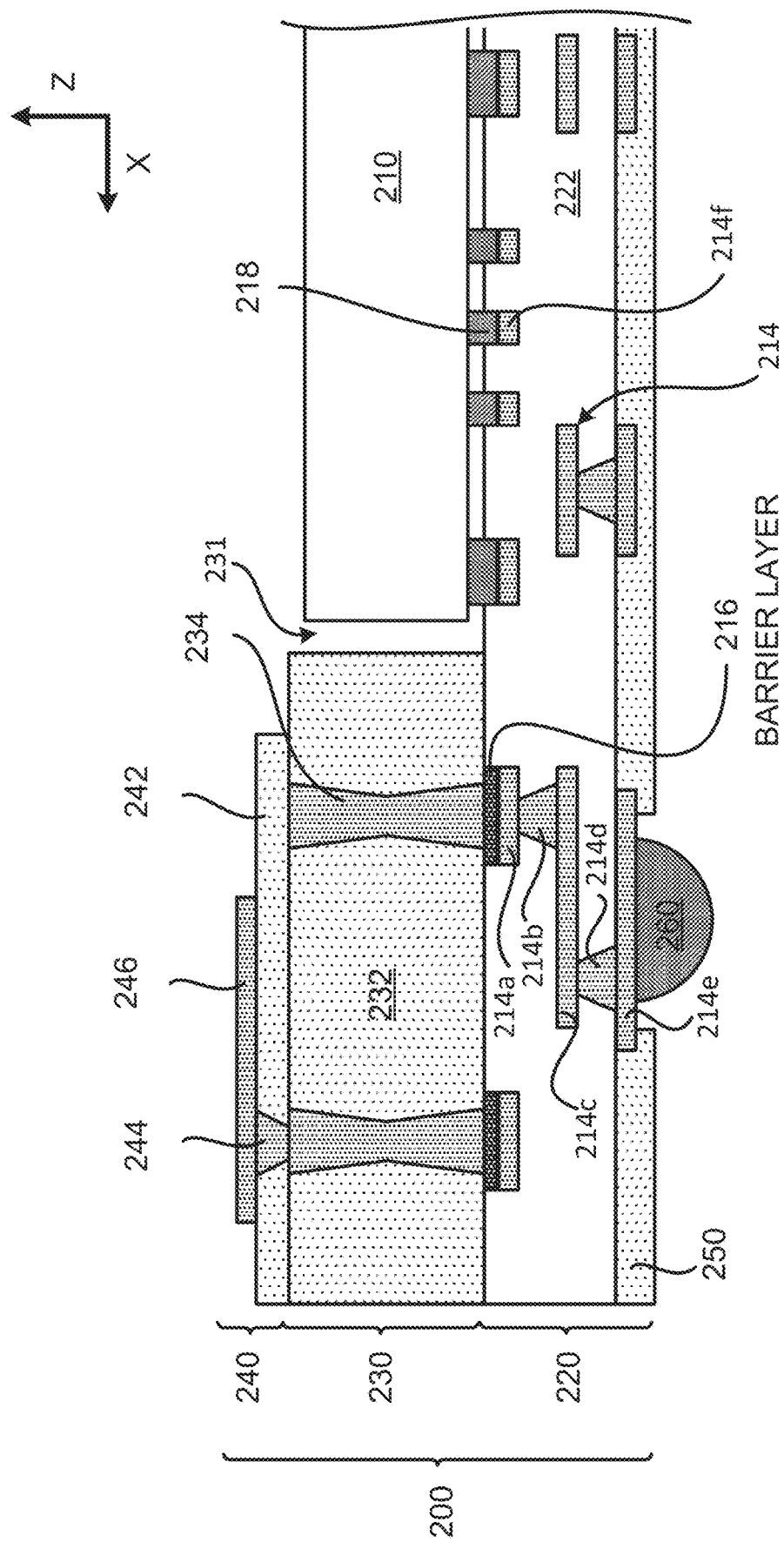
FIG. 3 illustrates a close up cross-sectional view of part of a low profile package that includes a die, an interposer and a redistribution portion.

The redistribution portion 220 includes at least one dielectric layer 222, a plurality of redistribution interconnects 214 and at least one barrier layer 216 (e.g., means for barrier). The redistribution portion 220 may also include a solder resist layer 250. The redistribution portion 220 may be a means for redistribution. The plurality of redistribution interconnects 214 may includes several redistribution interconnects (e.g., 214a-214f as shown in FIG. 3). The plurality of redistribution interconnects 214 may comprise a trace, a pad and/or a via. The barrier layer 216 (e.g., means for barrier) is similar to a redistribution interconnect, but is made of a different material or composition than the plurality of redistribution interconnects 214. In some implementations, the barrier layer 216 may include nickel (Ni). In some implementations, the barrier layer 216 is used to control with greater accuracy and precision what it etched in the package 200, resulting in better yields and more reliable connections in the package 200. An exemplary use and purpose of the barrier layer 216 is further illustrated and described in detail in FIGS. 8A-8E.

In some implementations, the plurality of redistribution interconnects 214 may include copper (Cu). A solder is coupled to the redistribution portion 220. The redistribution portion 220 will be described in more details below in FIG. 3.

The interposer 230 includes at least one dielectric layer 232 and at least one interposer interconnect 234. The interposer interconnect 234 travels through the dielectric layer 232. The interposer interconnect 234 is coupled to the barrier layer 216 of the redistribution portion 220. The interposer interconnect 234 may include a via. In some implementations, the interposer interconnect 234 (e.g., vias) in the interposer 230 may have a diameter or width in a range of about 70-100 microns (µm). The interposer 230 will be described in more details below in FIG. 3.

The backside redistribution portion 240 includes a dielectric layer 242, a redistribution interconnect 244 and a redistribution interconnect 246. The redistribution interconnect 244 may include a via, and the redistribution interconnect 246 may include a trace. The backside redistribution portion 240 may also include other redistribution interconnects, such as a pad. The redistribution interconnect 244 is coupled to the interposer interconnect 234. The backside redistribution portion 240 may be a means for backside redistribution.

There are several technical advantages to the package 200. One, as mentioned above, the package 200 has a much lower profile or thickness than other known packages. Two, the package 200 can be fabricated without the use of an encapsulation layer that encapsulates the first die 210. In other know packages, the fabrication process requires that an encapsulation layer be used as support for the die. Without the encapsulation layer, it would not be possible to fabricate such processes. This is because the fabrication of other known packages requires the die to be provided early in the fabrication process. Such fabrication processes produce lower integrated devices yield and thus are inherently costlier. In the case of the package 200, as will be further described below in FIGS. 8A-8E, there is no need for an encapsulation layer around the first die 210, as the first die 210 is provided much later in the fabrication process. Thus, an encapsulation layer is optional for the package 200, which saves time and money, reducing the overall cost the package 200. As such, in some implementations, a substantial portion of the side surface of the first die 210 is free of an encapsulation layer. That is, in some implementations of the package 200, the side surface of the first die 210 that is facing the interposer 230 (e.g., facing the dielectric layer 232 of the interposer 230) is substantially free of an encapsulation layer (e.g., means for encapsulation). In some implementations, a region (e.g., lateral region) and/or gap (e.g., lateral gap) between the first die 210 and the interposer 230 (e.g., substrate) is substantially free of an encapsulation layer. The term substantially free may mean that at least fifty percent (50%) of the side surface of the first die 210 facing the interposer 230 is free of a material (e.g., encapsulation layer) and/or or at least fifty percent (50%) of a region (e.g., lateral region) and/or gap (e.g., lateral gap) between the side surface of the first die 210 and the interposer 230 is free of a material (e.g., encapsulation layer). It is noted that in some implementations, there may be an encapsulation layer between the first die 210 and the interposer 230 (e.g., substrate comprising interposer interconnect). In addition, in some implementations, there may be an encapsulation layer formed over a backside of the first die 210. As will be further described below, the package 200 may be a very thin package that is formed by coupling the first die 210 to the package later in a fabrication process.

Even though there is a lateral gap between the first die 210 and the interposer 230, the lateral gap is so small that very little encapsulant (e.g., mold, resin, epoxy) would be able to flow through if the encapsulant would be provided after the package 200 is fabricated. Also, by not having the encapsulation layer, the overall size or footprint of package may be reduced because there is no need to account for the extra material (e.g., encapsulation layer) when creating the cavity 231 in the interposer 230. However, as mentioned above, some implementations may still include an encapsulation layer (not shown) that is formed over a backside of the first die 210. That is, some implementations of the package 200 may include an encapsulation layer that at least partially encapsulates the first die 210. As mentioned, there still may be a little bit of an encapsulant (e.g., encapsulation layer) in a region and/or gap between the first die 210 and the interposer 230. Examples of an encapsulation layer (e.g., means for encapsulation) include a mold, a resin, and/or an epoxy fill.

Another technical advantage of the package 200 is the lack of certain elements that are present in other known packages. For example, in other known packages that includes an interposer, the interposer includes a metal ring (e.g., copper ring) that surrounds a die. In other known packages, the metal ring is a by-product or artifact of the fabrication process used to fabricate these known packages. The metal ring serves no functional purpose in these known packages (e.g., does not provide an electrical path in the known package) and thus takes up unnecessary spaces in these known packages. However, this metal ring in an interposer is not found in the package 200 nor the interposer 230. As a result, the package 200 and the interposer 230 are free of a metal ring that surrounds the first die 210, simplifying the package 200 and the interposer 230, and allowing other interconnects (e.g., interposer interconnects) to pass through in a space that would have otherwise been used by a metal ring. In some implementations, the absence of the metal ring in the interposer 230 and the package 200 is made possible through the fabrication process (e.g., FIGS. 8A-8E) described in the present application.

In some implementations, the package 200 is made possible through fabrication processes described in the present application. These fabrication processes are described further below.

Exemplary Low Profile Package

FIG. 3 illustrates a close up profile view of the package 200. As mentioned above, the package 200 includes the first die 210, the redistribution portion 220, the interposer 230 and the backside redistribution portion 240. In some implementations, the height of the package 200 is in a range of about 200-300 microns (µm). In some implementations, a side surface of the first die 210 that is facing the interposer 230, is substantially free of an encapsulation layer. In some implementations, a region (e.g., lateral region) and/or gap (e.g., lateral gap) between the first die 210 and the interposer 230 (e.g., substrate) is substantially free of an encapsulation layer. The term substantially free may mean that at least fifty percent (50%) of the side surface of the first die 210 facing the interposer 230 (e.g., substrate) is free of a material (e.g., encapsulation layer) and/or or at least fifty percent (50%) of a region (e.g., lateral region) and/or gap (e.g., lateral gap) between the side surface of the first die 210 and the interposer 230 (e.g., substrate) is free of a material (e.g., encapsulation layer). It is noted that in some implementations, there may be an encapsulation layer between the first die 210 and the interposer 230 (e.g., substrate comprising interposer interconnect).

The first die 210 is located in the cavity 231 of the interposer 230. The first die 210 is laterally surrounded by the interposer 230. An active side of the first die 210 faces the redistribution portion 220. The first die 210 is coupled (e.g., electrically coupled) to the redistribution portion 220 through the plurality of interconnects 218. In some implementations, the plurality of interconnects 218 is directly coupled to the plurality of redistribution interconnects 214. In such instances, there is no barrier layer 216 between the plurality of redistribution interconnects 214 and the plurality of interconnects 218. However, in some implementations, there may be a barrier layer (e.g., barrier layer 216) between the plurality of redistribution interconnects 214 and the plurality of interconnects 218.

The redistribution portion 220 includes at least one dielectric layer 222, the plurality of redistribution interconnects 214, at least one barrier layer 216 and the solder resist layer 250. The plurality of redistribution interconnects 214 includes a redistribution interconnect 214a, a redistribution interconnect 214b, a redistribution interconnect 214c, a redistribution interconnect 214d, a redistribution interconnect 214e, and a redistribution interconnect 214f.

The redistribution interconnect 214a (e.g., pad) is coupled to the barrier layer 216. The redistribution interconnect 214b (e.g., via) is coupled to the redistribution interconnect 214a. The redistribution interconnect 214c (e.g., trace) is coupled to the redistribution interconnect 214b. The redistribution interconnect 214d (e.g., via) is coupled to the redistribution interconnect 214c. The redistribution interconnect 214e (e.g., pad) is coupled to the redistribution interconnect 214d. FIG. 3 also illustrates that the redistribution interconnect 214f (e.g., pad) is coupled to an interconnect from the plurality of interconnects 218 of the first die 210. The plurality of interconnects 218 may be at least partially embedded in the redistribution portion 220. For example, the plurality of interconnects 218 may be at least partially embedded in the dielectric layer 222 of the redistribution portion 220. As shown in FIG. 3, there is no barrier layer between the plurality of interconnects 218 and the redistribution interconnect 214f. However, it is noted that in some implementations, there may be solder interconnect between the plurality of interconnects 218 and the redistribution interconnect 214f.

In some implementations, the redistribution interconnects 214a and 214f are on a first metal layer (M1) of the redistribution portion 220, the redistribution interconnect 214b is between the first and a second metal layers (M1-M2) of the redistribution portion 220, the redistribution interconnect 214c is on a second metal layer (M2) of the redistribution portion 220, the redistribution interconnect 214d is between a second and third metal layers (M2-M3) of the redistribution portion 220, and the redistribution interconnect 214e is on a third metal layer (M3) of the redistribution portion 220. In some implementations, the first metal layer (M1) has a thickness of about 10 microns (μm), the area between the first and second metal layers (M1-M2) has a thickness of about 10 microns (μm), the second metal layer (M2) has a thickness of about 5 microns (μm), the area between the second and third metal layer (M2-M3) has a thickness of about 10 microns (μm), and the third metal layer (M3) has a thickness of about 10 microns (μm). The solder resist layer 250 may have a thickness of about 12 microns (μm). In some implementations, the redistribution portion 220 comprises a thickness in a range of about 40-100 microns (μm).

The interposer 230 includes at least one dielectric layer 232 and at least one interposer interconnect 234. The interposer 230 laterally surrounds the first die 210. As shown in FIG. 3, there is lateral gap between the interposer 230 and the first die 210. The lateral gap or lateral space between the interposer 230 and the first die 210 is substantially free of an encapsulation layer. The term substantially free may mean that at least fifty percent (50%) of the lateral gap or lateral space is free of a material (e.g., encapsulation layer). A first surface of the interposer 230 is coupled to the redistribution portion 220. In particular, the interposer interconnect 234 is coupled (e.g., electrically coupled) to the barrier layer 216 of the redistribution portion 220. In some implementations, the interposer 230 comprises a thickness or height in a range of about 140-160 microns (μm).

The backside redistribution portion 240 is coupled to the interposer 230. In particular, a first surface of the backside redistribution portion 240 is coupled to a second surface of the interposer 230. The second surface of the interposer 230 may be a surface opposite to the first surface of the interposer 230. The backside redistribution portion 240 may be configured to couple to another package (e.g., another package of a package on package (PoP) device.

The backside redistribution portion 240 includes a dielectric layer 242, a redistribution interconnect 244 and a redistribution interconnect 246. The redistribution interconnect 244 may include a via, and the redistribution interconnect 246 may include a trace. The backside redistribution portion 240 may also include other redistribution interconnects, such as a pad. The redistribution interconnect 244 is coupled (e.g., electrically coupled) to the interposer interconnect 234. The dielectric layer 242 may be a photoimageable dielectric (PID) layer (e.g., dielectric layer that can be etched through a photo etching process). In some implementations, the backside redistribution portion 240 comprises a thickness or height in a range of about 25-35 microns (μm).

Having described a low profile package that includes a die, an interposer and a redistribution portion, several processes for fabricating an interposer for the low profile package will now be described below.

Exemplary Sequence for Fabricating an Interposer

In some implementations, providing/fabricating a low profile interposer includes several processes. FIG. 4 (which includes FIGS. 4A-4D) illustrates an exemplary sequence for providing/fabricating a low profile interposer, which can be used in a low profile package. In some implementations, the sequence of FIGS. 4A-4D may be used to provide/fabricate the interposer 230 of the package 200 of FIGS. 2-3 and/or other interposers described in the present disclosure. However, for the purpose of simplification, FIGS. 4A-4D will be described in the context of providing/fabricating the interposer 230 of FIG. 3.

It should be noted that the sequence of FIGS. 4A-4D may combine one or more stages in order to simplify and/or clarify the sequence for providing an interposer. In some implementations, the order of the processes may be changed or modified.

Figure 4A:
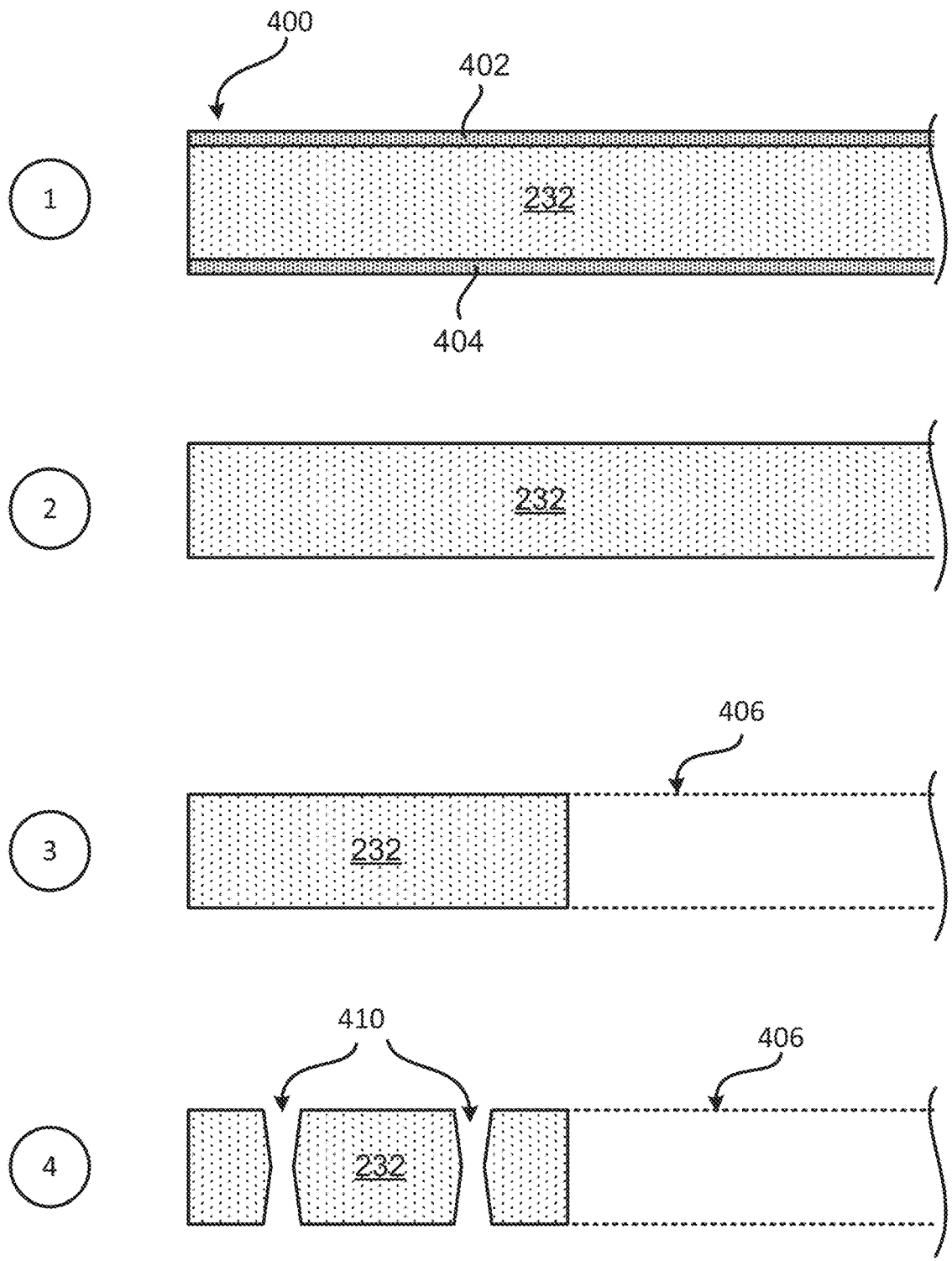
FIG. 4 (which includes FIGS. 4A-4D) illustrates an example of a sequence for fabricating an interposer for a low profile package.

Stage 1, as shown in FIG. 4A, illustrates a state after a core 400 that includes the dielectric layer 232, a first metal layer 402 (e.g., copper) and a second metal layer 404 (e.g., copper) is provided or fabricated. In some implementations, the core 400 may not include the first metal layer 402 and the second metal layer 404 when it is provided.

Stage 2 illustrates a state after the first metal layer 402 and the second metal layer 404 are removed (e.g., etched out).

Stage 3 illustrates a state after a cavity 406 is formed in the dielectric layer 232. In some implementations, a laser ablation (e.g., laser etching) process is used to form the cavity 406. The cavity 406 travels through the entirety of the dielectric layer 232.

Stage 4 illustrates a state after several cavities 410 (e.g., interconnect cavities, via cavities) are formed in the dielectric layer 232. In some implementations, a laser ablation (e.g., laser etching) process is used to form the cavities 410.

Figure 4B:
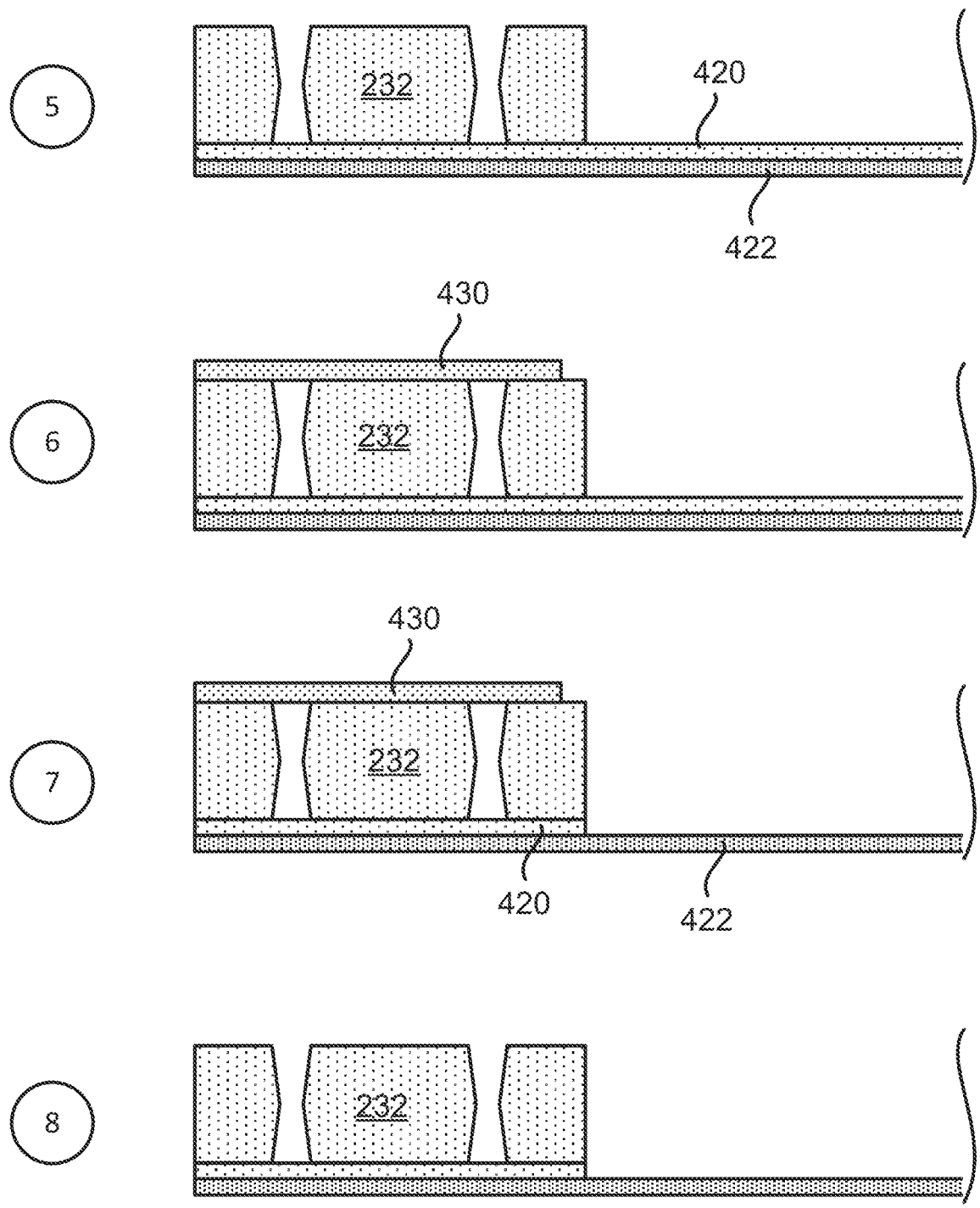

Stage 5, as shown in FIG. 4B, illustrates a state after several lamination layers are provided over the dielectric layer 232 (e.g., over first surface of the dielectric layer 232). In particular, a resin layer 420 and a metal layer 422 (e.g., copper foil) are provided (e.g., formed, laminated) over the dielectric layer 232. In some implementations, the combination of the resin layer 420 and the metal layer 422 may be a resin coated copper (RCC) foil.

Stage 6 illustrates a state after a laminate layer 430 is formed over a second surface of the dielectric layer 232. The laminate layer 430 may be a dry film resist (DRF) layer. Stage 6 may also illustrate a state after exposure and developing has occurred. The laminate layer 430 cover the cavities 410.

Stage 7 illustrates a state after portions of the resin layer 420 have been selectively removed. For example, portions of the resin layer 420 that is not coved by the laminate layer 430 or the dielectric layer 232 are selectively removed. In some implementations, a sand blasting process is used to selectively remove portions of the resin layer 420.

Stage 8 illustrates a state after the laminate layer 430 is decoupled (e.g., removed) from the dielectric layer 232.

Figure 4C:
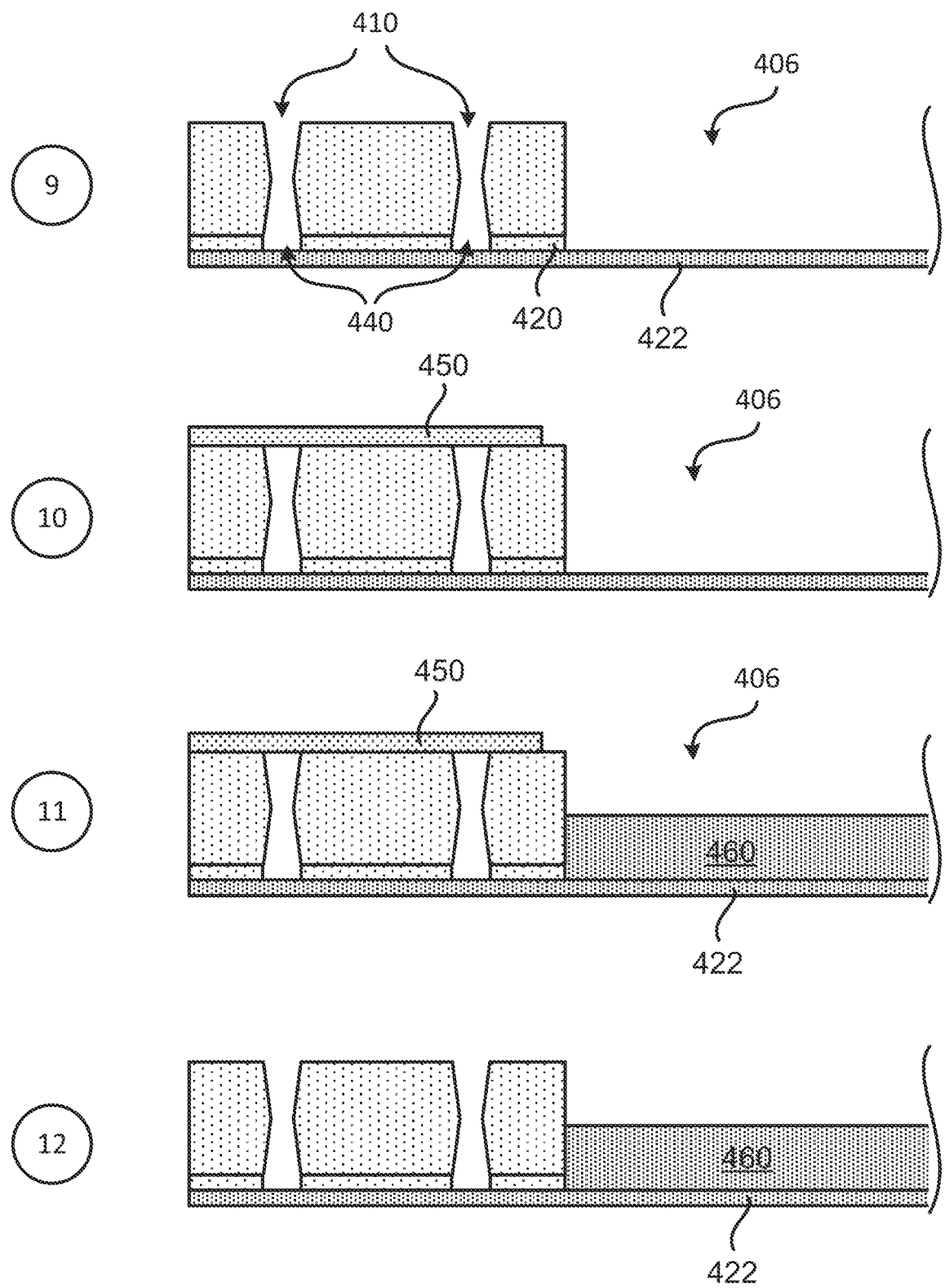

Stage 9, as shown in FIG. 4C, illustrates a state after cavities 440 are formed in the resin layer 420. The cavities 440 such that they extend the cavities 410. A laser ablation process may be used to form the cavities 440.

Stage 10 illustrates a state after a laminate layer 450 is formed over a second surface of the dielectric layer 232. The laminate layer 450 may be a dry film resist (DRF) layer. The laminate layer 450 cover the cavities 410.

Stage 11 illustrates a state after a metal layer 460 is formed in the cavity 406. A plating process (e.g., copper plating) may be use to form the metal layer 460. The metal layer 460 only partially fills the cavity 406. Different implementations may fill the cavity 406 with the metal layer 460 differently.

Stage 12 illustrates a state after the laminate layer 450 is decoupled (e.g., removed) from the dielectric layer 232.

Figure 4D:
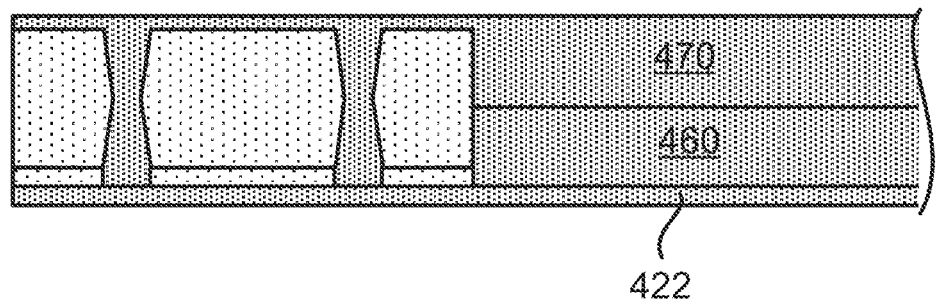
Figure 4D:
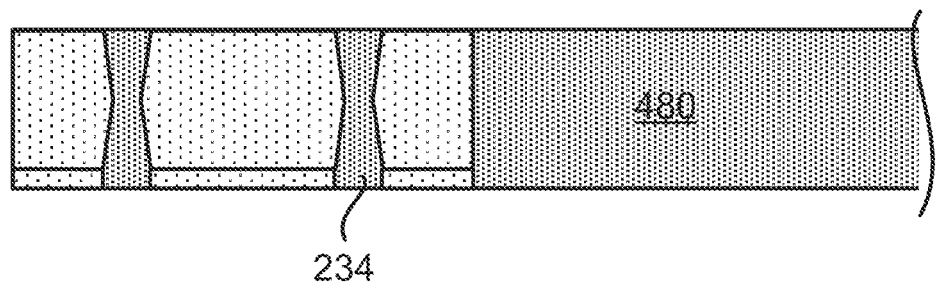
Figure 4D:
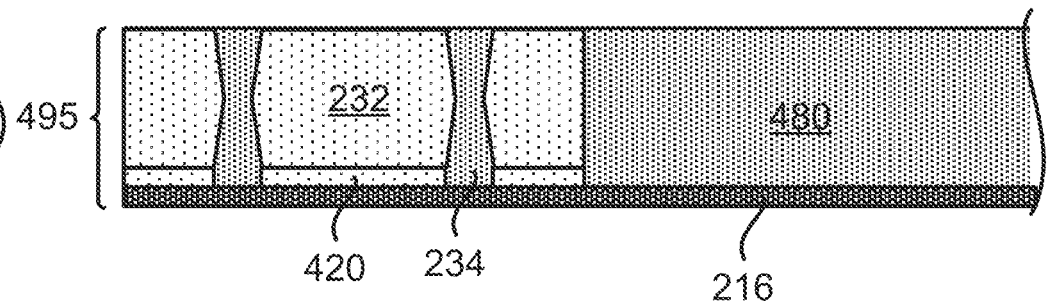

Stage 13, as shown in FIG. 4D, illustrates a state after a metal layer 470 is formed in the cavity 406, the cavities 410 and the cavities 440. A plating process (e.g., copper plating) may be use to form the metal layer 470. The metal layer 470 may be the same, similar or different than the metal layer 460.

Stage 14 illustrates a state after portions of the metal layer 470 and the metal layer 422 are removed. In some implementations, an etching process is used to remove portions of the metal layer 470 and the metal layer 422. Stage 14 illustrates a metal layer 480 which represents the combination of metal layer 460 and metal layer 470. The metal layer 480 may include one homogenous metal layer, a composite metal layer and/or a combination of separate metal layers. Stage 14 further illustrates that the metal layer 470 formed in the cavities 410 and the cavities 440 form the interposer interconnect 234 (e.g., via).

Stage 15 illustrates a state after the barrier layer 216 is formed on a first surface of the dielectric layer 232. A laminate layer (e.g., DFR layer) may be provided and subsequently removed, on a second surface of the dielectric layer 232 during a process that forms the barrier layer 216. The barrier layer 216 may include nickel (Ni). Stage 15 illustrates an interposer 495 that includes the dielectric layer 232, the resin layer 420, the interposer interconnect 234, the metal layer 480 and the barrier layer 216. In some implementations, the interposer 495 may be used formed and placed in the package 200 of FIG. 2 or FIG. 3.

The above sequence illustrates one example of fabricating an interposer. There are other ways of fabricating an interposer.

Exemplary Sequence for Fabricating an Interposer

Figure 5A:
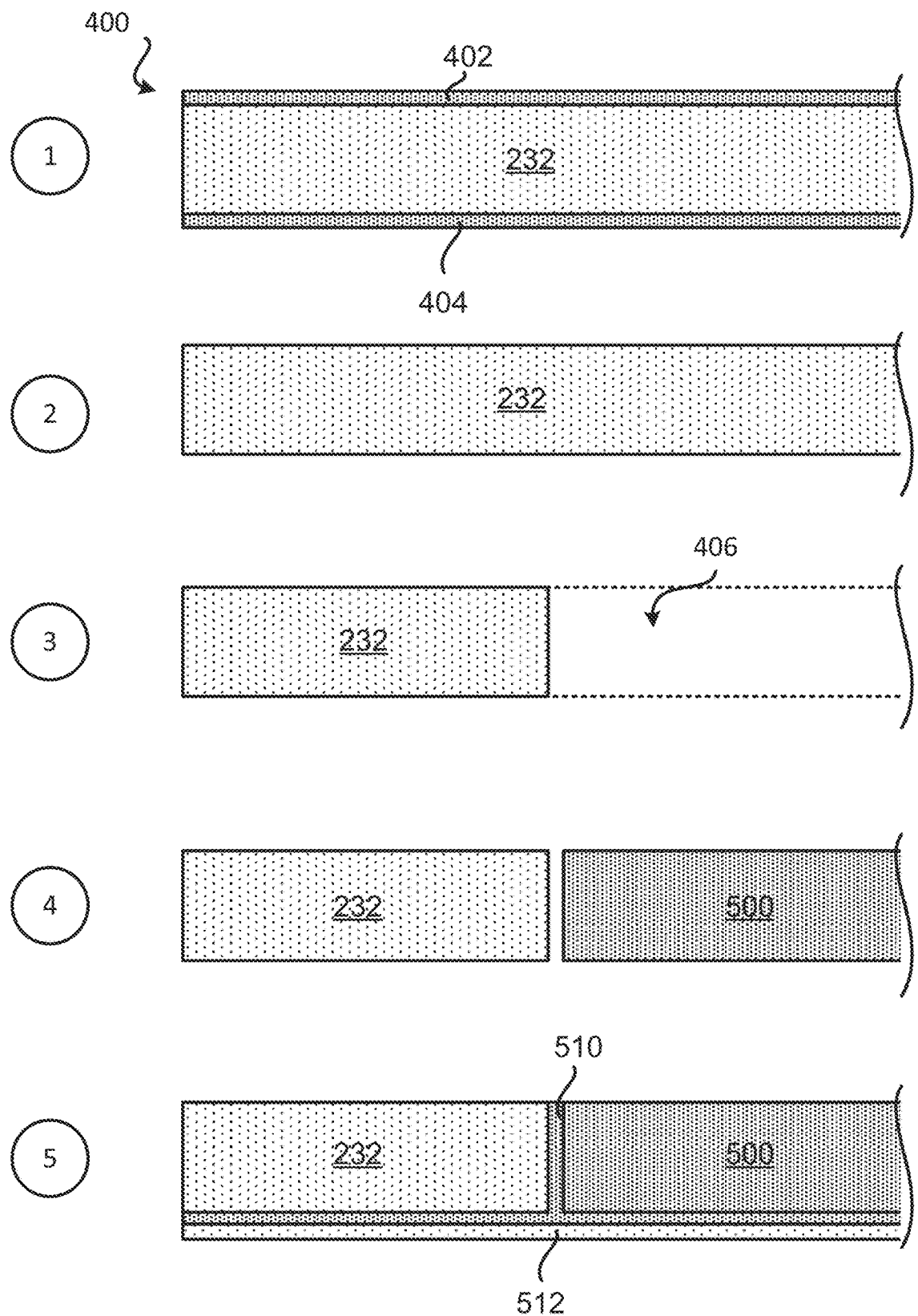
FIG. 5 (which includes FIGS. 5A-5C) illustrates another example of a sequence for fabricating an interposer for a low profile package.
Figure 5B:
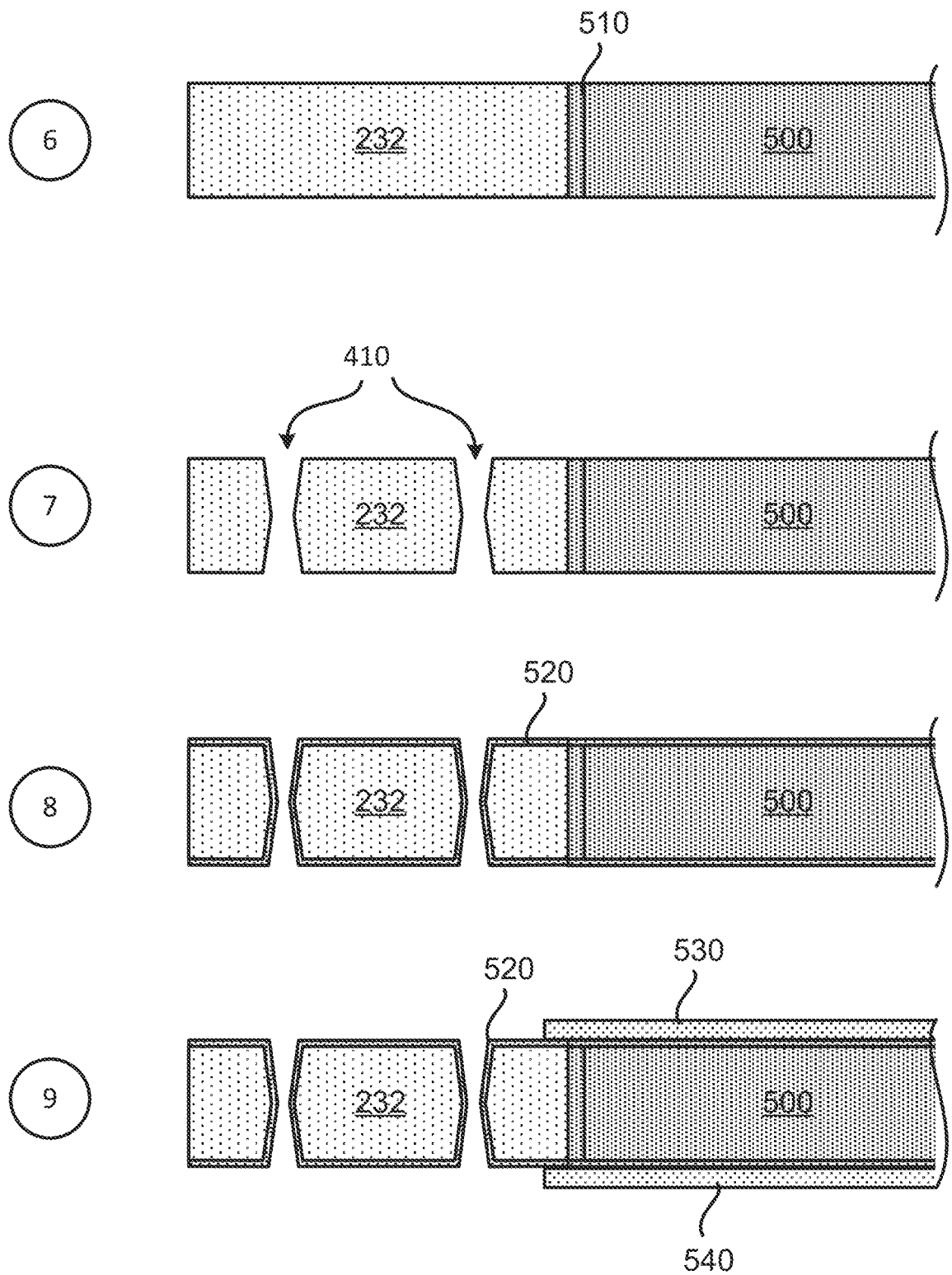
Figure 5C:
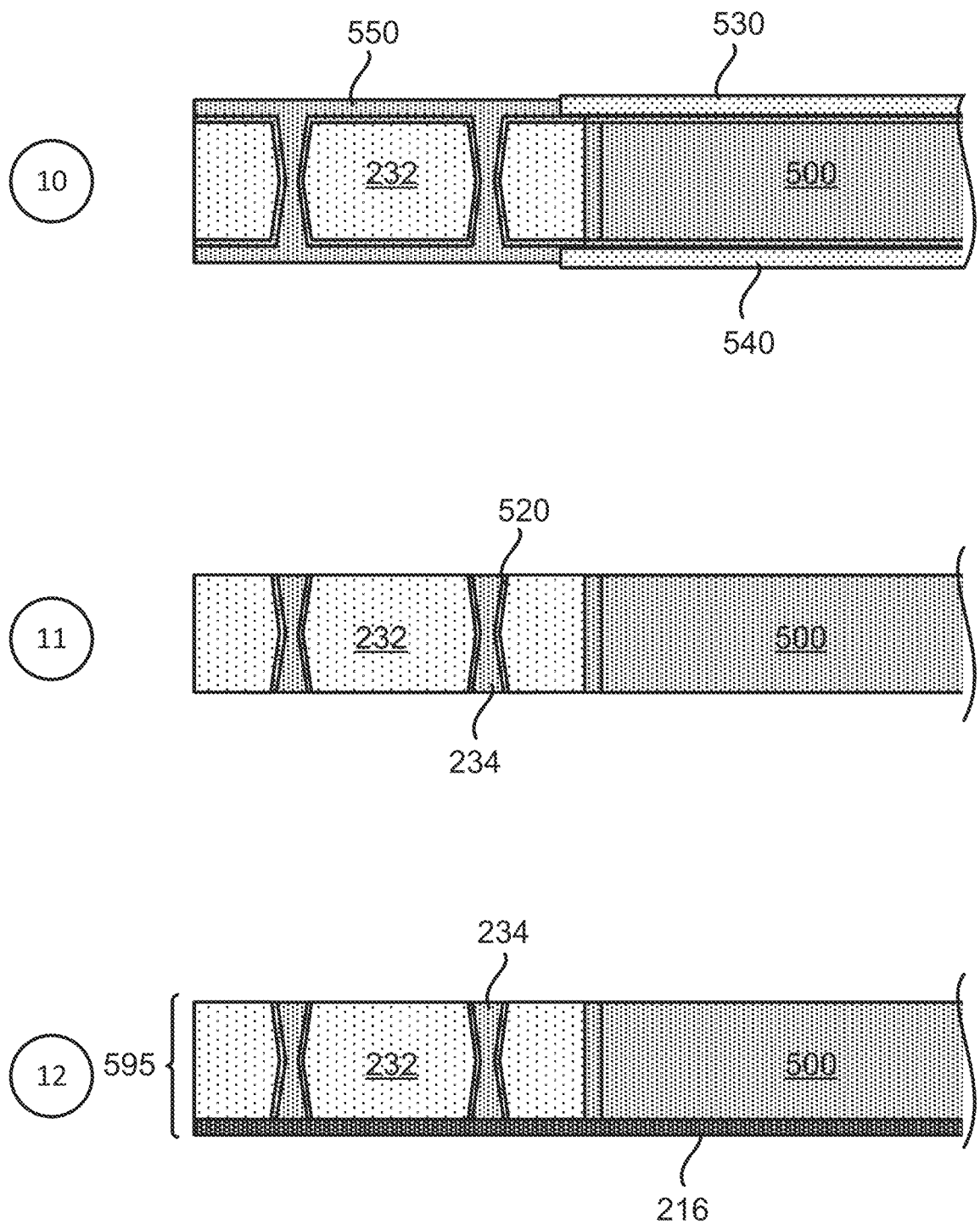

In some implementations, providing/fabricating a low profile interposer includes several processes. FIG. 5 (which includes FIGS. 5A-5C) illustrates an exemplary sequence for providing/fabricating a low profile interposer, which can be used in a low profile package. In some implementations, the sequence of FIGS. 5A-5C may be used to provide/fabricate the interposer 230 of the package 200 of FIGS. 2-3 and/or other interposers described in the present disclosure. However, for the purpose of simplification, FIGS. 5A-5C will be described in the context of providing/fabricating the interposer 230 of FIG. 3.

It should be noted that the sequence of FIGS. 5A-5C may combine one or more stages in order to simplify and/or clarify the sequence for providing an interposer. In some implementations, the order of the processes may be changed or modified.

Stage 1, as shown in FIG. 5A, illustrates a state after a core 400 that includes the dielectric layer 232, a first metal layer 402 (e.g., copper) and a second metal layer 404 (e.g., copper) is provided or fabricated. In some implementations, the core 400 may not include the first metal layer 402 and the second metal layer 404 when it is provided.

Stage 2 illustrates a state after the first metal layer 402 and the second metal layer 404 are removed (e.g., etched out).

Stage 3 illustrates a state after a cavity 406 is formed in the dielectric layer 232. In some implementations, a laser ablation (e.g., laser etching) process is used to form the cavity 406. The cavity 406 travels through the entirety of the dielectric layer 232.

Stage 4 illustrates a state after a metal block 500 (e.g., copper block) is provided in the cavity 406. Different implementations may provide different blocks. In some implementations, the metal block 500 is provided with the help of a temporary adhesive. For example, a temporary adhesive may be placed prior to the metal block being placed in the cavity 406.

Stage 5 illustrates a state after a resin layer 510 and metal layer 512. The resin layer 510 is located between the dielectric layer 232 and the metal block 500. The metal layer 512 is formed on the resin layer 510. In some implementations, the combination of the resin layer 510 and the metal layer 512 may be a resin coated copper (RCC) foil.

Stage 6, as shown in FIG. 5B, illustrates a state after portions of the resin layer 510 and the metal layer 512. In some implementations, an etching process, a grinding and/or a blasting process may be used to remove the resin layer 510 and the metal layer 512. For example, an etching process may remove the metal layer 512 and a grinding process or a blasting process may be used to remove the resin layer 510. In some implementations, Stage 6 may also illustrate a state after the temporary adhesive has been removed.

Stage 7 illustrates a state after several cavities 410 (e.g., interconnect cavities, via cavities) are formed in the dielectric layer 232. In some implementations, a laser ablation (e.g., laser etching) process is used to form the cavities 410.

Stage 8 illustrates a state after a metal layer 520 is formed over the surface of dielectric layer 232 and the metal block 500. In some implementations, an electroless plating process (e.g., electroless copper plating process).

Stage 9 illustrates a state after a laminate layer 530 and a laminate layer 540 are provided over portions of the metal layer 520. In some implementations, stage 9 illustrates a state after exposure and development.

Stage 10, as shown in FIG. 5C, illustrates a state after a metal layer 550 is formed over the metal layer 520 that is not covered by the laminate layer 530 and the laminate layer 540. In some implementations, a plating process is used to form the metal layer 550. The metal layer 550 may be the similar or different than the metal layer 520.

Stage 11 illustrates a state after the laminate layer 530 and the laminate layer 540 are decoupled (e.g., removed) from the metal layer 520. Stage 11 also illustrates where portions of the metal layer 520 and portions of the metal layer 550 are removed (e.g., etched). Stage 11 illustrates the interposer interconnect 234, which is formed from the metal layer 550. In some implementations, the interposer interconnect 234 may also include the metal layer 520.

Stage 12 illustrates a state after the barrier layer 216 is formed on a first surface of the dielectric layer 232. A laminate layer (e.g., DFR layer) may be provided and subsequently removed, on a second surface of the dielectric layer 232 during a process that forms the barrier layer 216. The barrier layer 216 may include nickel (Ni). Stage 12 illustrates an interposer 595 that includes the dielectric layer 232 the interposer interconnect 234, the metal layer 520, the metal block 500, and the barrier layer 216. In some implementations, the interposer 595 may be formed and placed in the package 200 of FIG. 2 or FIG. 3.

The above sequence illustrates one example of fabricating an interposer. There are other ways of fabricating an interposer.

Exemplary Sequence for Fabricating an Interposer

In some implementations, providing/fabricating a low profile interposer includes several processes. FIG. 6 (which includes FIGS. 6A-6B) illustrates an exemplary sequence for providing/fabricating a low profile interposer, which can be used in a low profile package. In some implementations, the sequence of FIGS. 6A-6B may be used to provide/fabricate the interposer 230 of the package 200 of FIGS. 2-3 and/or other interposers described in the present disclosure. However, for the purpose of simplification, FIGS. 6A-6B will be described in the context of providing/fabricating the interposer 230 of FIG. 3.

Figure 6A:
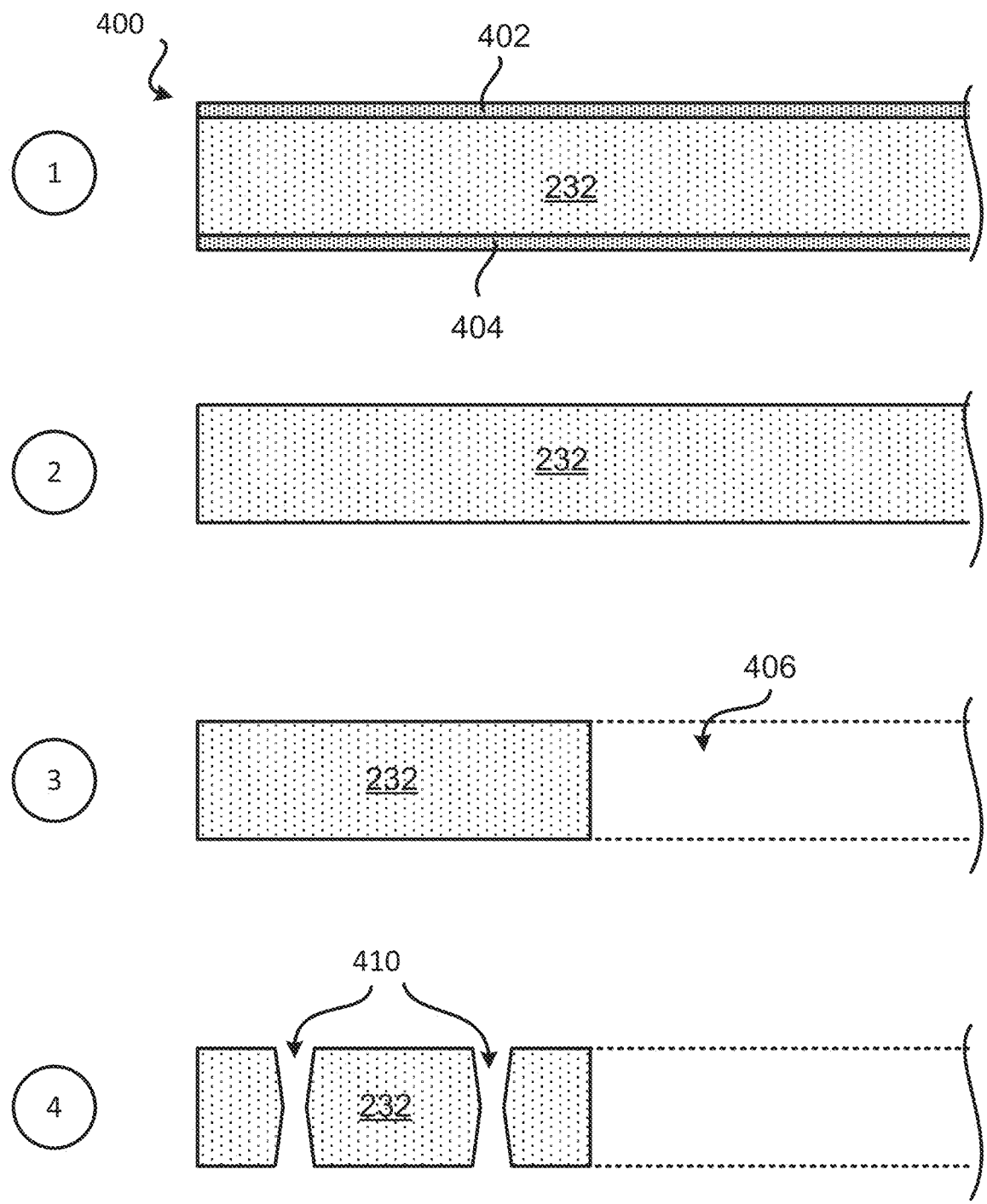
FIG. 6 (which includes FIGS. 6A-6B) illustrates an example of a sequence for fabricating an interposer for a low profile package.
Figure 6B:
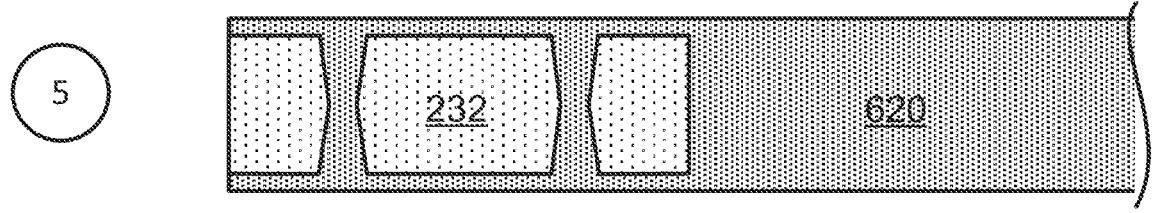
Figure 6B:
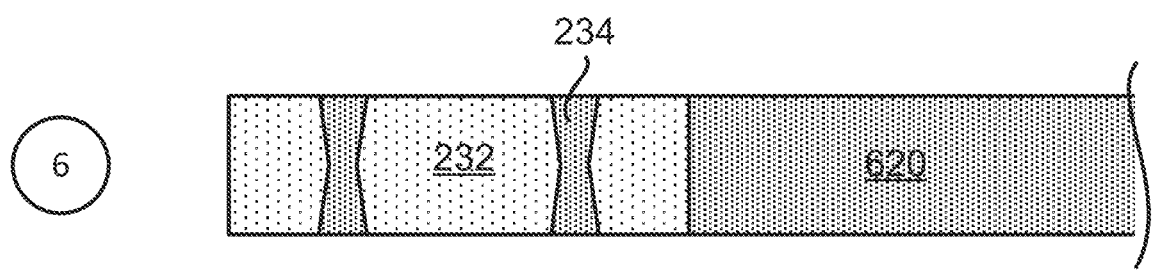
Figure 6B:
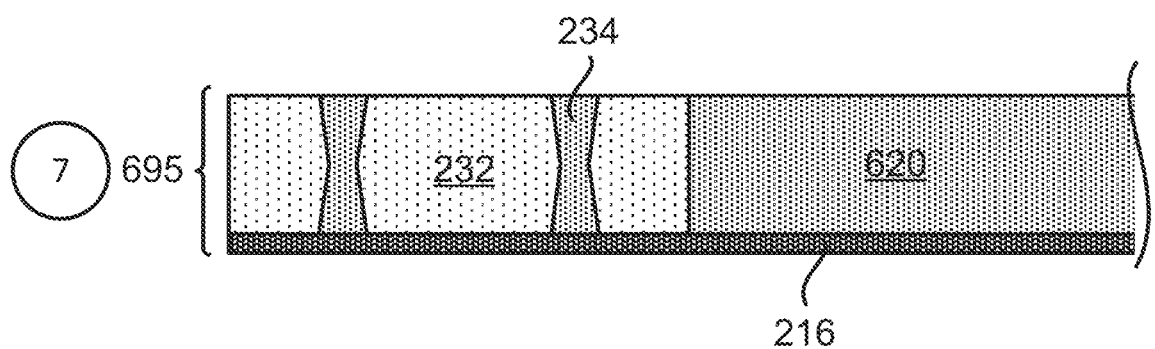

It should be noted that the sequence of FIGS. 6A-6B may combine one or more stages in order to simplify and/or clarify the sequence for providing an interposer. In some implementations, the order of the processes may be changed or modified.

Stage 1, as shown in FIG. 6A, illustrates a state after a core 400 that includes the dielectric layer 232, a first metal layer 402 (e.g., copper) and a second metal layer 404 (e.g., copper) is provided or fabricated. In some implementations, the core 400 may not include the first metal layer 402 and the second metal layer 404 when it is provided. Stage 2 illustrates a state after the first metal layer 402 and the second metal layer 404 are removed (e.g., etched out).

Stage 3 illustrates a state after a cavity 406 is formed in the dielectric layer 232. In some implementations, a laser ablation (e.g., laser etching) process is used to form the cavity 406. The cavity 406 travels through the entirety of the dielectric layer 232.

Stage 4 illustrates a state after several cavities 410 (e.g., interconnect cavities, via cavities) are formed in the dielectric layer 232. In some implementations, a laser ablation (e.g., laser etching) process is used to form the cavities 410.

Stage 5, as shown in FIG. 6B, illustrates a metal layer 620 is formed in the cavity 406 and the cavities 410. In some implementations, a desmear process, an electroless plating process, and/or a tenting fill process are used to form the metal layer 620. Different implementations may use different materials (e.g., copper) for the metal layer 620.

Stage 6 illustrates a state after portions of the metal layer 620 are selectively removed. In some implementations, a buffing process and/or an etching process are used to selectively remove portions of the metal layer 620. This process may leave behind the interposer interconnect 234 which is made from the metal layer 620.

Stage 7 illustrates a state after the barrier layer 216 is formed on a first surface of the dielectric layer 232. A laminate layer (e.g., DFR layer) may be provided and subsequently removed, on a second surface of the dielectric layer 232 during a process that forms the barrier layer 216. The barrier layer 216 may include nickel (Ni). Stage 7 illustrates an interposer 695 that includes the dielectric layer 232, the interposer interconnect 234, the metal layer 4620 and the barrier layer 216. In some implementations, the interposer 695 may be used formed and placed in the package 200 of FIG. 2 or FIG. 3.

Exemplary Method for Fabricating an Interposer for a Low Profile Package

Figure 7:
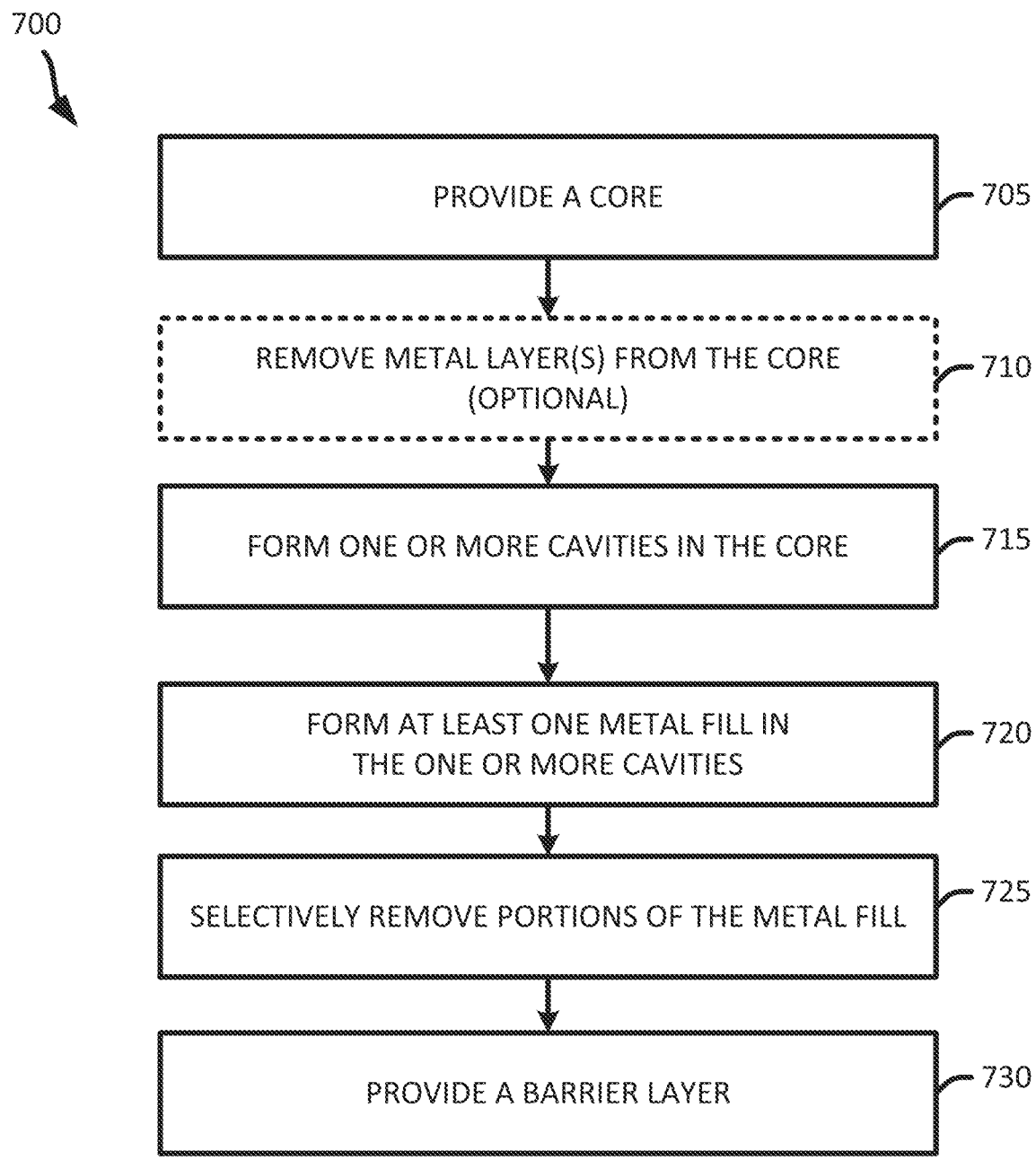
FIG. 7 illustrates a flow diagram of an exemplary method for fabricating an interposer for a low profile package.

In some implementations, providing/fabricating an interposer includes several processes. FIG. 7 illustrates an exemplary flow diagram of a method 700 for providing/fabricating an interposer for a low profile package. In some implementations, the method of FIG. 7 may be used to provide/fabricate the interposer of FIGS. 2-3, 4A-4D, 5A-5C, 6A-6B and/or other interposers described in the present disclosure. However, for the purpose of simplification, FIG. 7 will be described in the context of providing/fabricating the interposer of FIGS. 6A-6B.

It should be noted that the flow diagram of FIG. 7 may combine one or more processes in order to simplify and/or clarify the method for providing an interposer. In some implementations, the order of the processes may be changed or modified.

The method provides (at 705) a core (e.g., core 400). The core 400 may include the dielectric layer 232, a first metal layer 402 (e.g., copper) and a second metal layer 404 (e.g., copper). In some implementations, the core 400 may not include the first metal layer 402 and the second metal layer 404 when it is provided. In some implementations, the core may only include a dielectric layer.

The method optionally removes (at 710) the metal layers from the core. For example, the method may remove the first metal layer 402 and the second metal layer 404 from the core 400. In some implementations, removing the metal layers include etching the metal layers. In some implementations, the core may only include a dielectric layer, and as such, there may not be a need to remove the metal layer(s).

The method forms (at 715) one or more cavities in the dielectric layer. For example, the method may form a cavity 406 and cavities 410 in the dielectric layer 232. In some implementations, a laser ablation (e.g., laser etching) process is used to form the cavity 406 and the cavities 410. The cavity 406 and the cavities 410 travel through the entirety of the dielectric layer 232.

The method forms (at 720) one or more metal fill in the cavities. For example, the method may form a metal layer 620 in the cavity 406 and the cavities 410. In some implementations, forming the metal fill may include a desmear process, an electroless plating process, and/or a tenting fill process. Different implementations may use different materials (e.g., copper) for the metal layer 620. Different implementations may also use different processes to form one or more metal fill. Other examples of such different processes are described in FIGS. 4A-4D and FIGS. 5A-5C.

The method selectively removes (at 725) portions of the metal fill. For example, the method may selectively remove portions of the metal layer 620. In some implementations, a buffing process and/or an etching process are used to selectively remove portions of the metal layer 620. This process may leave behind the interposer 695 that includes the metal layer 620. Different implementations may use different processes to selectively remove metal fill and/or metal layers. Other examples of such different processes are described in FIGS. 4A-4D and FIGS. 5A-5C.

The method provides (at 730) a barrier layer. For example, the method may form the barrier layer 216 over a first surface of the dielectric layer 232. A laminate layer (e.g., DFR layer) may be provided and subsequently removed, on a second surface of the dielectric layer 232 during a process that forms the barrier layer 216. The barrier layer 216 may include nickel (Ni). The barrier layer (e.g., means for barrier) helps in the selective etching of interconnects and protects the interconnects from damage from a laser ablation process during the fabrication of the package.

Having described several sequences and method for fabricating an interposer, a sequence for fabricating a low profile package that includes an interposer will now be described below.

Exemplary Sequence for Fabricating a Low Profile Package

In some implementations, providing/fabricating a low profile package includes several processes. FIG. 8 (which includes FIGS. 8A-8E) illustrates an exemplary sequence for providing/fabricating a low profile package. In some implementations, the sequence of FIGS. 8A-8E may be used to provide/fabricate the package 200 of FIGS. 2-3 and/or other packages described in the present disclosure. However, for the purpose of simplification, FIGS. 8A-8E will be described in the context of providing/fabricating the package 200 of FIG. 3. For the purpose of simplification, the interposer 695 will be used as the initial interposer. However, the process described in the following sequence may use any of the interposers described in the present application, such as interposer 495 and interposer 595. An interposer may be a form of a substrate.

It should be noted that the sequence of FIGS. 8A-8E may combine one or more stages in order to simplify and/or clarify the sequence for providing a low profile package. In some implementations, the order of the processes may be changed or modified.

Figure 8A:
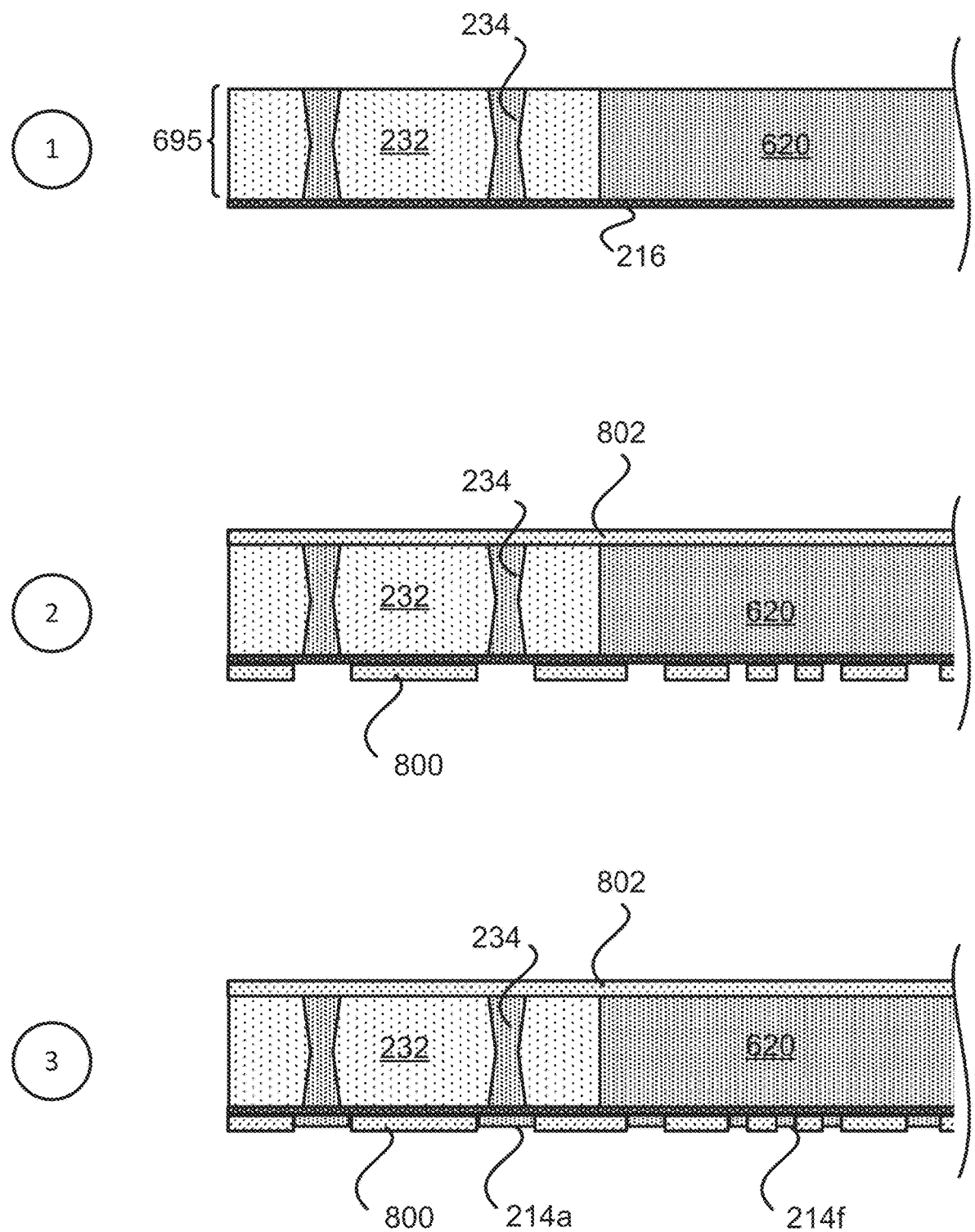
FIG. 8 (which includes FIGS. 8A-8E) illustrates an example of a sequence for fabricating a low profile package that includes a die, an interposer and a redistribution portion.
Figure 8B:
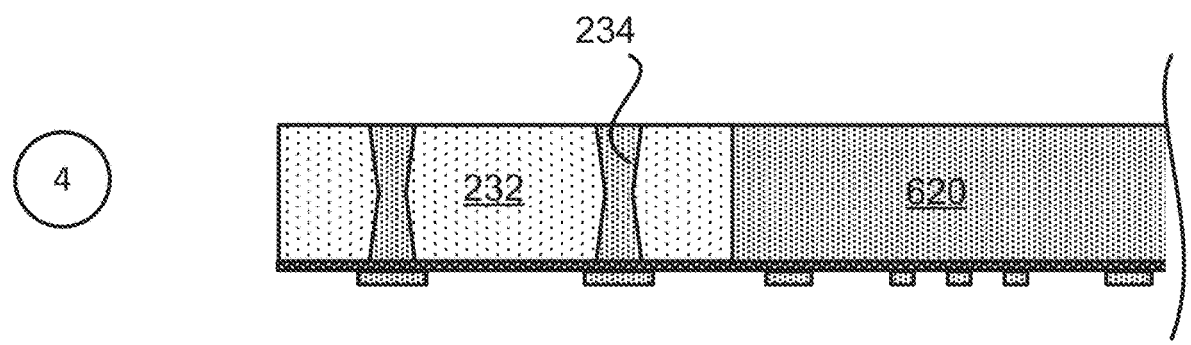
Figure 8B:
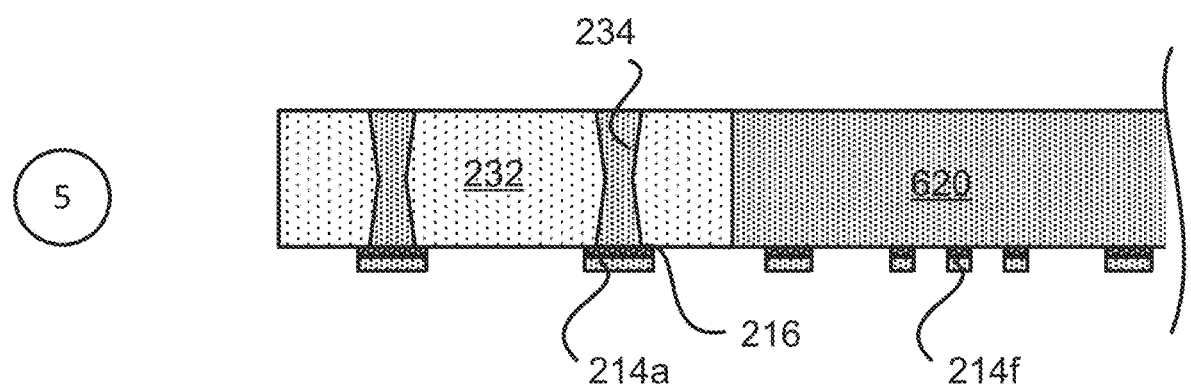
Figure 8B:
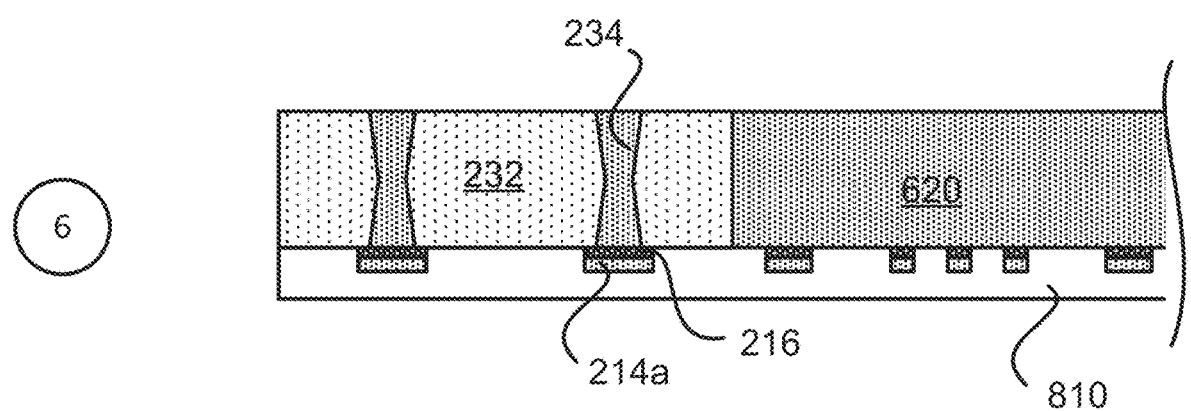

Stage 1, as shown in FIG. 8A, illustrates a state after the interposer 695 is provided. The interposer 695 includes the dielectric layer 232, the interposer interconnect 234, the metal layer 620 and the barrier layer 216. As mentioned above, in some implementations, a different interposer may be provided, such as interposer 495 and/or interposer 595.

Stage 2 illustrates a state after laminate layer 800 and a laminate layer 802 are provided on the interposer 595. In particular, a laminate layer 800 is formed over a first surface of the interposer 695, and a laminate layer 802 is formed over a second surface of the interposer 695. The laminate layer 800 and laminate layer 802 may be dry resist film (DRF) layers. The laminate layer 800 may be formed over the barrier layer 216. The laminate layer 800 is patterned (e.g., by expose and development).

Stage 3 illustrates a state after a metal layer is formed over the barrier layer 216. The metal layer may be formed such that the redistribution interconnect 214a and the redistribution interconnect 214f are formed. The metal layer may be made of a different material and/or composition than the barrier layer 216. In some implementations, the metal layer that is formed a first metal layer (M1) of a redistribution portion 220. In some implementations, the metal layer formed in the first metal layer (M1) has a thickness of about 10 microns (μm).

Stage 4 illustrates a state after the laminate layer 800 and the laminate layer 802 are decoupled (e.g., removed) from the interposer 695.

Stage 5 illustrates a state after portions of the barrier layer 216 are selectively removed (e.g., etched out). In particular, in some implementations, portions of the barrier layer 216 that are not covered by the metal layer (e.g., redistribution interconnect 214a), are removed (e.g., etched out).

Stage 6 illustrates a state after a dielectric layer 810 is formed over the metal layer, the dielectric layer 232 and the metal layer 620. In some implementations, the dielectric layer 810 is a buildup film lamination layer.

Figure 8C:
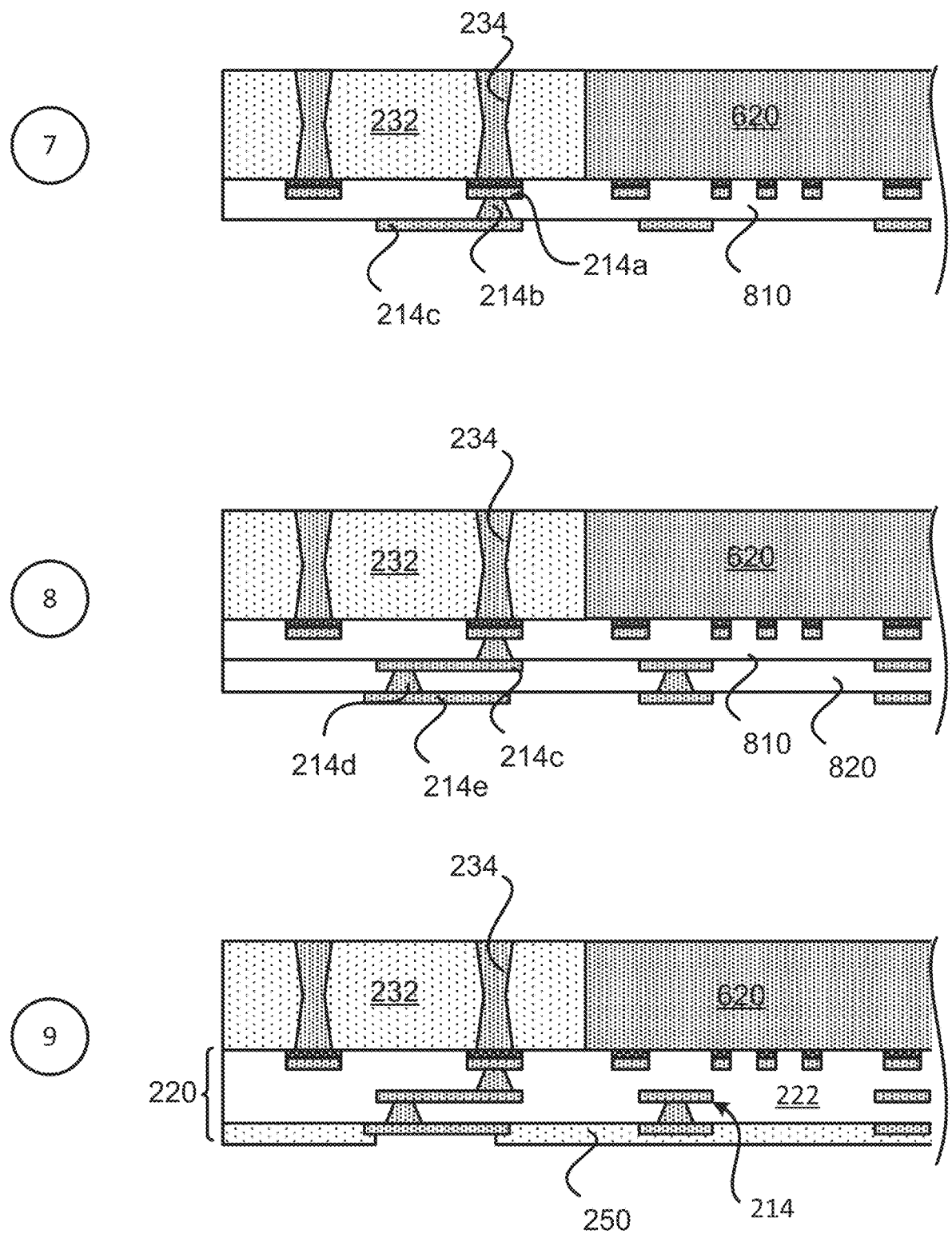

Stage 7, as shown in FIG. 8C, illustrates several metal layers being formed in and/or on the dielectric layer 810. For example, the redistribution interconnect 214b, and the redistribution interconnect 214c are formed on and in the dielectric layer 810. In some implementations, Stage 7 illustrates a state after via formation, a desmear process and a second metal layer patterning process (e.g., plating process).

Stage 8 illustrates a state after a dielectric layer 820 and metal layers are formed. In some implementations, the dielectric layer 820 is a buildup film lamination layer. The metal layers form the redistribution interconnect 214d and the redistribution interconnect 214e. In some implementations, Stage 8 illustrates a state after a repeat of the buildup after Stages 6 and 7 using a different pattern. That is the process may be similar, but using a different set of patterns for the metal layers and redistribution interconnects.

Stage 9 illustrates a state after a solder resist layer 250 is provided over the redistribution interconnects 214 and/or the dielectric layer 222. It is noted that the dielectric layer 222 may represent the dielectric layer 810 and the dielectric layer 820. Stage 9 illustrates a redistribution portion 220 that is formed and coupled to a first surface of the interposer 695.

Figure 8D:
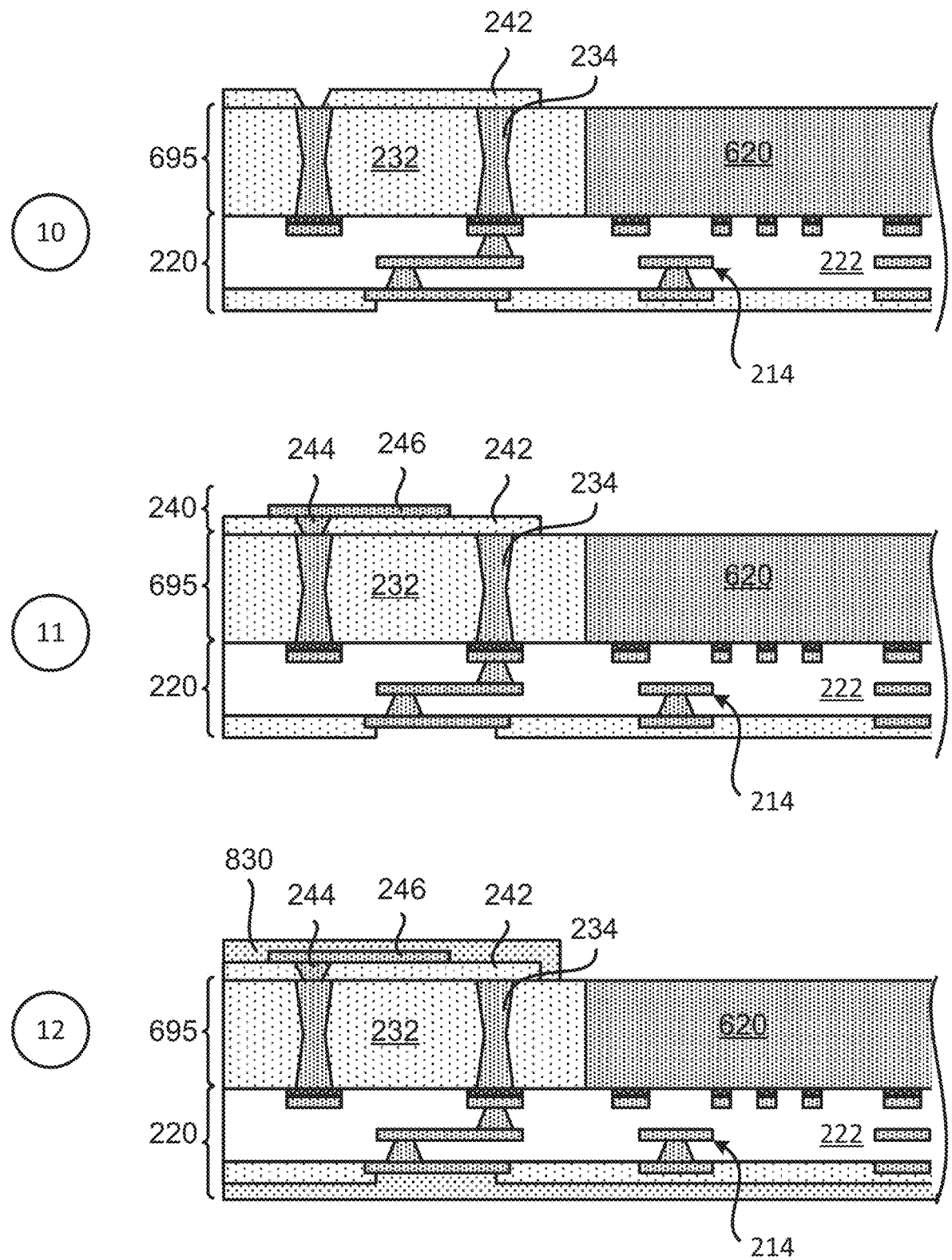

Stage 10, as shown in FIG. 8D, illustrates a state after a dielectric layer 242 is formed a second surface of the interposer 695. In some implementations, the dielectric layer 242 comprises a photoimageable dielectric (PID) layer (e.g., dielectric layer that can be removed through a photo developing process). In some implementations, the process of providing the dielectric layer 242 may includes lamination, exposure and development.

Stage 11 illustrates a state after a redistribution interconnect 244 and a redistribution interconnect 246 are formed. In some implementations, a plating process is used to form the redistribution interconnect.

Stage 12 illustrates a state after a laminate layer 830 is provided over the backside redistribution portion 240. The laminate layer 830 may be a dry film resist (DFR) layer that is used for a masking process.

Figure 8E:
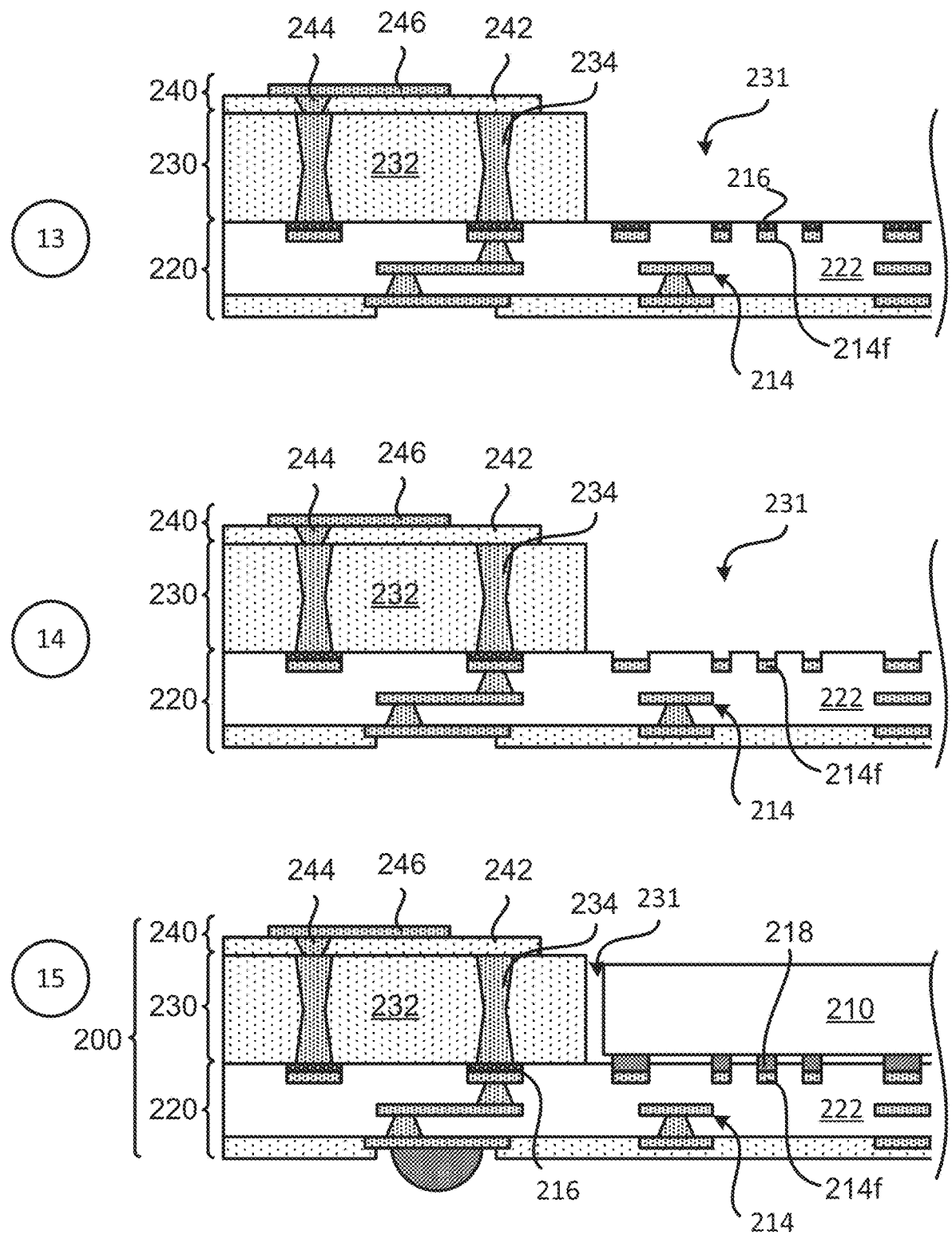

Stage 13, as shown in FIG. 8E, illustrates a state after a cavity 231 is formed in the interposer 695. In some implementations, a laser ablation process is used to form the cavity 231. Stage 13 illustrates a state that all of the metal layer 620 has been removed. In some implementations, not all of the metal layer 620 may be removed. Stage 13 also illustrates a state after the laminate layer 830 (e.g., DFR layer) has been decoupled (e.g., removed) from the backside redistribution portion 240. In some implementations, Stage 13 may illustrate a state of the interposer 230 after the removal of the metal layer 620. An etching process used to remove the metal layer 620 can cause substantial damage to the redistribution interconnects (e.g., 214f) of the redistribution portion 220. However, in this example, the barrier layer 216 protects the redistribution interconnects (e.g., 214f) of the redistribution portion 220 during the removal of the metal layer 620.

Stage 14 illustrates a state after portions of the barrier layer 216 that have been exposed by the cavity 231 are removed (e.g., etched out). In some implementations, a process that is less damaging than laser ablation may be used to remove the barrier layer 216 above the redistribution interconnects (e.g., 214f) of the redistribution portion 220. Thus, the barrier layer 216 allows for better control of the fabrication of redistribution interconnects and provides better interconnects by reducing, minimizing or eliminating damage to the redistribution interconnects.

Stage 15 illustrates a state after the first die 210 is coupled to the redistribution portion 220 though the cavity 231 of the interposer 230. In particular, the first die 210 is coupled to the plurality of redistribution interconnects 214 through the plurality of interconnects 218. As shown in Stage 15, there is no barrier layer 216 in the redistribution portion 220, between the plurality of interconnects 218 and the plurality of redistribution interconnects 214. However, it is noted that in some implementations, there may a barrier layer 216 (e.g., residual barrier layer) between the plurality of interconnects 218 and the redistribution interconnects 214. Stage 15 also illustrates a state after a solder 260 is coupled to the redistribution portion 220.

Exemplary Method for Fabricating a Low Profile Package

Figure 9:
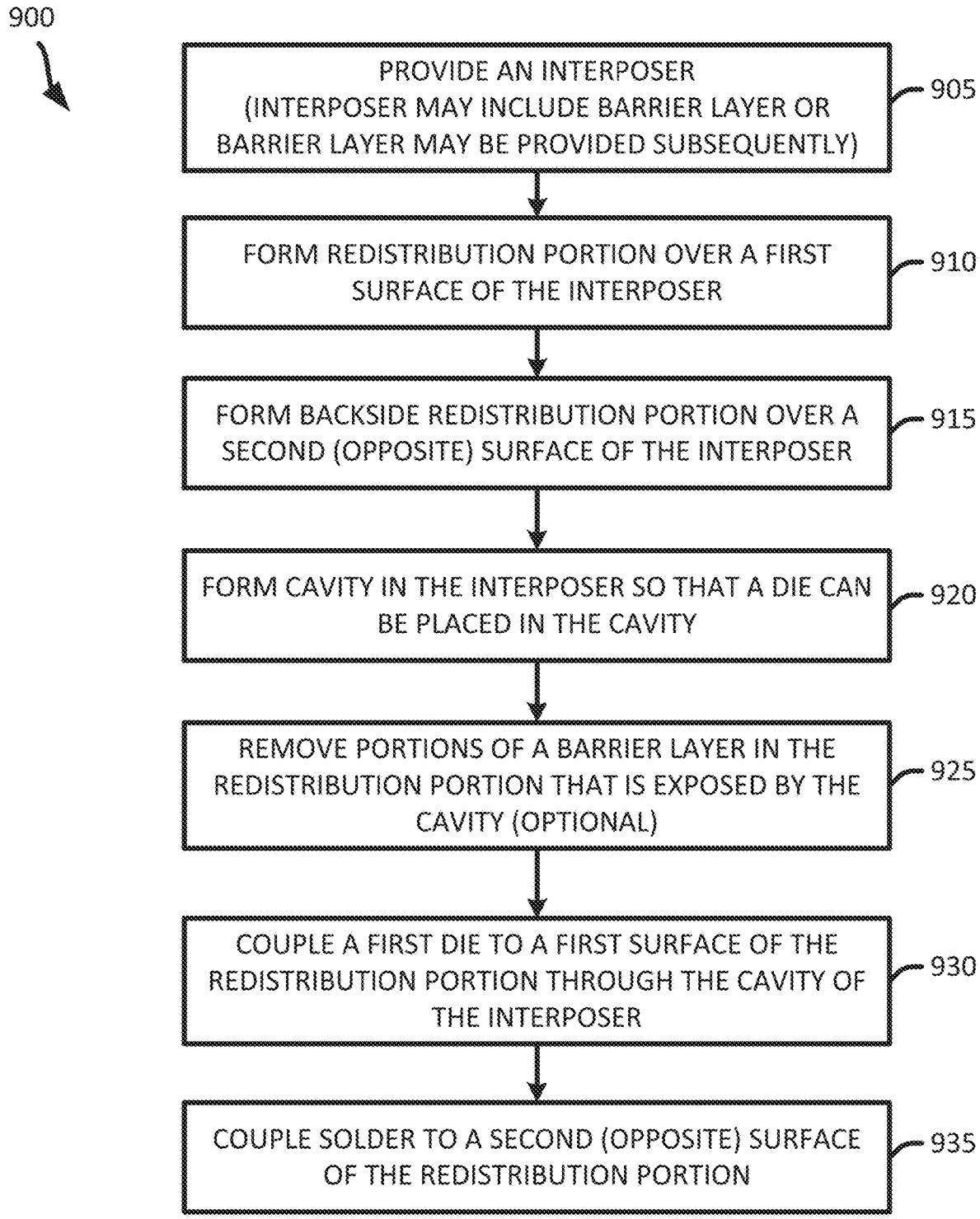
FIG. 9 illustrates a flow diagram of an exemplary method for fabricating a low profile package that includes a die, an interposer and a redistribution portion.

In some implementations, providing/fabricating a low profile package includes several processes. FIG. 9 illustrates an exemplary flow diagram of a method 900 for providing/fabricating a low profile package. In some implementations, the method 900 of FIG. 9 may be used to provide/fabricate the package of FIGS. 2-3 and/or other packages described in the present disclosure. However, for the purpose of simplification, FIG. 9 will be described in the context of providing/fabricating the package of FIG. 3.

It should be noted that the flow diagram of FIG. 9 may combine one or more processes in order to simplify and/or clarify the method for providing an interposer. In some implementations, the order of the processes may be changed or modified.

The method provides (at 905) an interposer (e.g., interposer 695). Different implementations may provide different interposers. In some implementations, providing an interposer includes providing (e.g., fabricating) an interposer that includes at least one dielectric layer, one or more interposer interconnects (e.g., vias) and a barrier layer. An interposer may be a form of a substrate. Examples of interposers are described in FIGS. 3, 4A-4D, 5A-5C, and 6A-6B. For example, the interposer 695 may include the dielectric layer 232, the interposer interconnect 234, the metal layer 620 and the barrier layer 216. In some implementations, providing (at 905) the interposer may be performed by method 700 of FIG. 7.

The method forms (at 910) a redistribution portion over a first surface of the interposer. For example, the method may form a redistribution portion 220 over a first surface of the interposer 695. In some implementations, forming a redistribution portion may include forming at least one dielectric layer (e.g., 222) and at least one metal layer. These metal layers may form at least one redistribution interconnect (e.g., 214a, 214b). Different implementations may use different processes for forming a redistribution portion. An example of forming a redistribution portion is described in FIGS. 8A-8E of the present application. In some implementations, forming a redistribution portion may include a lamination process, a patterning process, a desmear process, an etching process, a drilling process, a laser ablation process and/or a platting process.

The method forms (at 915) a backside redistribution portion over a second surface of the interposer. For example, the method may form a backside redistribution portion 240 over a second surface of the interposer 695. In some implementations, forming a backside redistribution portion may include forming at least one dielectric layer (e.g., 242) and at least one metal layer. Theses metal layers may form at least one redistribution interconnect (e.g., 244, 246). The dielectric layer may include a photoimageable dielectric layer. Different implementations may use different processes for forming a backside redistribution portion. An example of forming a backside redistribution portion is described in FIGS. 8A-8E of the present application. In some implementations, forming a backside redistribution portion may include a lamination process, a patterning process, a desmear process, an etching process, a drilling process, a laser ablation process and/or a platting process.

The method forms (at 920) a cavity in the interposer. The cavity is formed so that a die may be placed between the interposer. For example, the method may form a cavity 231 in the interposer 695. In some implementations, a laser ablation process may be used to form the cavity. In some implementations, forming the cavity may remove one or more metal layers in the interposer.

The method optionally removes (at 925) portions of the barrier layer in the redistribution portion that is exposed by the cavity of the interposer. For example, the method may remove (e.g., etch out) portions of the barrier layer that is exposed when the cavity 231 was formed in the interposer 695.

The method couples (at 930) the first die to a first surface of the redistribution portion. For example, the method may couple the first die 210 to a first surface of the redistribution portion 220 through the cavity 231. In some implementations, the first die 210 is coupled to the plurality of redistribution interconnects 214 through the plurality of interconnects 218. In some implementations, there may be a barrier layer (e.g., barrier layer 216) between the plurality of redistribution interconnects 214 and the plurality of interconnects 218.

The method couples (at 935) solder (e.g., solder ball) to a second surface (e.g., opposite to the first surface) of the redistribution portion. For example, the method may couple a solder 260 to the second surface of the redistribution portion 220.

In some implementations, the method may couple to the backside redistribution portion of another package or die. For example, the method may couple one or more memory dies or packages to the backside redistribution portion. This may result in a package on package (PoP) device that includes two or more packages.

Exemplary Electronic Devices

Figure 10:
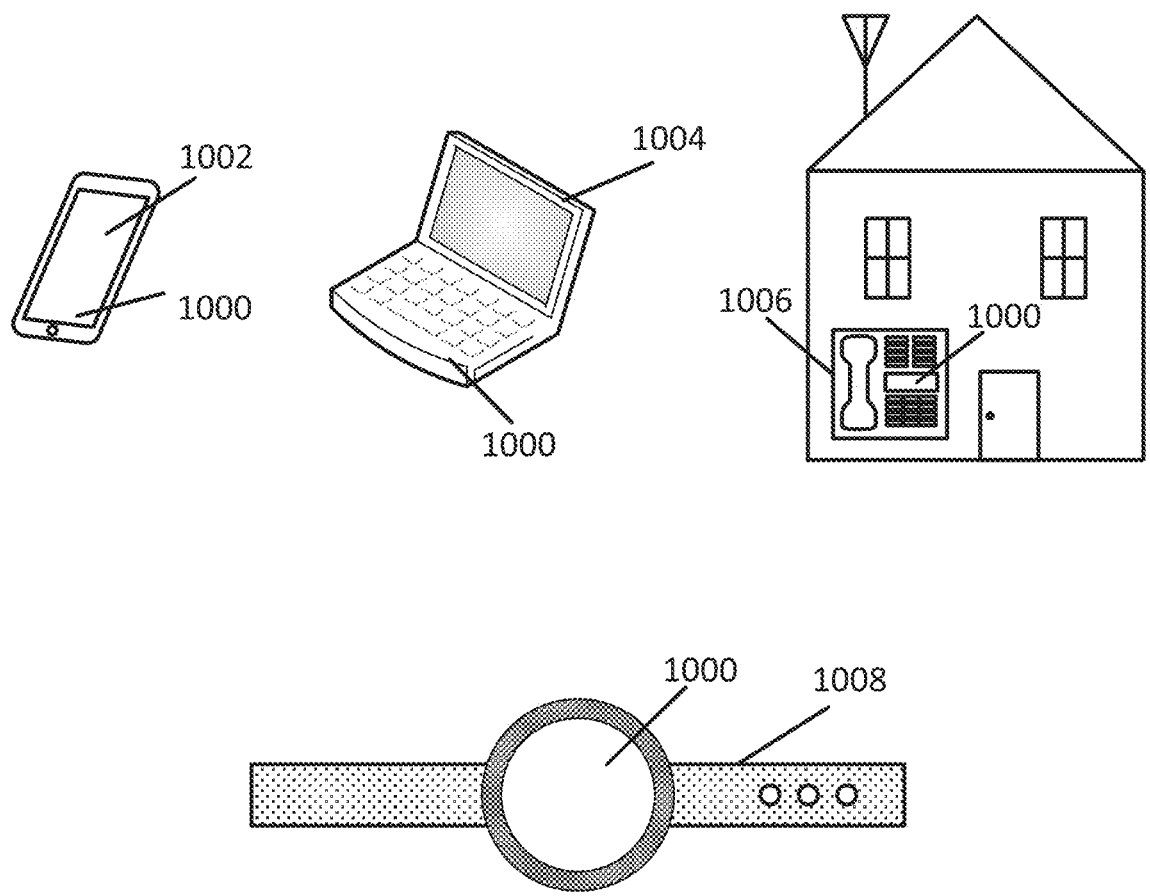
FIG. 10 illustrates various electronic devices that may include the various integrated devices, integrated device packages, semiconductor devices, dies, integrated circuits, and/or packages described herein.

FIG. 10 illustrates various electronic devices that may be integrated with any of the aforementioned integrated device, semiconductor device, integrated circuit, die, interposer, package or package-on-package (PoP). For example, a mobile phone device 1002, a laptop computer device 1004, and a fixed location terminal device 1006 may include an integrated device 1000 as described herein. The integrated device 1000 may be, for example, any of the integrated circuits, dies, integrated devices, integrated device packages, integrated circuit devices, device packages, integrated circuit (IC) packages, package-on-package devices described herein. The devices 1002, 1004, 1006 illustrated in FIG. 10 are merely exemplary. Other electronic devices may also feature the integrated device 1000 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2, 3, 4A-4D, 5A-5C, 6A-6B, 7, 8A-8E, 9, and/or 10 may be rearranged and/or combined into a single component, process, feature or function or embodied in several components, proceses, or functions. Additional elements, components, processes, and/or functions may also be added without departing from the disclosure. It should also be noted that FIGS. 2, 3, 4A-4D, 5A-5C, 6A-6B, 7, 8A-8E, 9, and/or 10 and its corresponding description in the present disclosure is not limited to dies and/or ICs. In some implementations, FIGS. 2, 3, 4A-4D, 5A-5C, 6A-6B, 7, 8A-8E, 9, and/or 10 and its corresponding description may be used to manufacture, create, provide, and/or produce integrated devices. In some implementations, a device may include a die, an integrated device, a die package, an integrated circuit (IC), a device package, an integrated package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package comprising:
   a substrate comprising an interposer interconnect and a cavity;
   a redistribution portion coupled to the substrate, the redistribution portion comprising a plurality of redistribution interconnects, a barrier layer, and a first interconnect coupled to the barrier layer, the barrier layer coupled to the interposer interconnect of the substrate;
   a first die coupled to the redistribution portion through the cavity of the substrate such that a region between the first die and the redistribution portion is free of an underfill; and
   an encapsulation layer located over a backside of the first die such that a lateral region between a side surface of the first die and the substrate is at least fifty percent free of the encapsulation layer.

2. The package of claim 1, wherein the lateral region between a side surface of the first die and the substrate includes the cavity.

3. The package of claim 1, wherein the lateral region between the side surface of the first die and the substrate is free of any solid material or component.

4. The package of claim 1, wherein the substrate is free of a metal ring that surrounds the first die.

5. The package of claim 1, wherein the substrate is located laterally to the first die.

6. The package of claim 1, wherein the substrate is an interposer comprising the interposer interconnect and the cavity.

7. The package of claim 1, wherein the redistribution portion further comprises a second interconnect coupled to the first die.

8. The package of claim 7, wherein the first die comprises a die interconnect that is directly coupled to the second interconnect of the redistribution portion.

9. The package of claim 7, wherein the first die comprises a die interconnect that is coupled to the second interconnect of the redistribution portion such that the die interconnect is at least partially embedded in the redistribution portion.

10. The package of claim 1, wherein the package comprises a thickness in a range of about 200-300 microns (μm) and the redistribution portion comprises a thickness in a range of about 40-100 microns (μm).

11. The package of claim 10, wherein the redistribution portion includes 2 or more metal layers.

12. The package of claim 1, wherein the plurality of redistribution interconnects comprises a via having a diameter of about 30 microns (μm), and the interposer interconnect comprises an interposer via comprising a diameter in a range of about 70-100 microns (μm).

13. The package of claim 1, further comprising a backside redistribution portion coupled to the substrate, the backside redistribution portion comprising a photo-imagable dielectric layer.

14. The package of claim 1, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

15. A package comprising:
    a substrate comprising an interposer interconnect and a cavity;

a redistribution portion coupled to the substrate, the redistribution portion comprising a plurality of redistribution interconnects and a barrier layer,
wherein the barrier layer is coupled to the interposer interconnect and a redistribution interconnect such that the barrier layer is located between the interposer interconnect and the redistribution interconnect, and
wherein the barrier layer comprises a different material than the redistribution interconnect; and
a first die coupled to the redistribution portion through the cavity of the substrate.

16. The package of claim 15, further comprising an encapsulation layer over a backside of the first die, wherein the substrate is free of a metal ring that surrounds the first die.

17. The package of claim 15, wherein the redistribution portion further comprises a second interconnect coupled to the first die.

18. The package of claim 17, wherein the first die comprises a die interconnect that is directly coupled to the second interconnect of the redistribution portion.

19. The package of claim 17, wherein the first die comprises a die interconnect that is coupled to the second interconnect of the redistribution portion such that the die interconnect is at least partially embedded in the redistribution portion.

20. The package of claim 15, wherein the package comprises a thickness in a range of about 200-300 microns (μm) and the substrate comprises a thickness in a range of about 140-160 microns (μm).

21. The package of claim 15, wherein the redistribution portion comprises a thickness in a range of about 40-100 microns (μm).

22. The package of claim 15, wherein the plurality of redistribution interconnects comprises a line and spacing (L/S) of about 5 microns (μm)/5 microns (μm).

23. The package of claim 15, wherein the plurality redistribution interconnects comprises a via having a diameter of about 30 microns (μm), and the interposer interconnect comprises an interposer via comprising a diameter in a range of about 70-100 microns (μm).

24. The package of claim 15, further comprising a backside redistribution portion coupled to the substrate, the backside redistribution portion comprising a photo-imagable dielectric layer.

25. The package of claim 15, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

26. An apparatus comprising:
means for substrate comprising an interposer interconnect and a cavity;
means for redistribution coupled to the means for substrate, the means for redistribution comprising a plurality of redistribution interconnects, a barrier layer, and a first interconnect coupled to the barrier layer, the barrier layer coupled to the interposer interconnect of the substrate;
a first die coupled to the means for redistribution through the cavity of the means for substrate such that a region between the first die and the means for redistribution is free of an underfill; and
an encapsulation layer located over a backside of the first die such that a lateral region between a side surface of the first die and the means for substrate is at least fifty percent free of the means for encapsulation.

27. The apparatus of claim 26, wherein the means for substrate is free of a metal ring that surrounds the first die.

28. An apparatus comprising:
means for substrate comprising an interposer interconnect and a cavity;
means for redistribution coupled to the means for substrate, the means for redistribution comprising a plurality of redistribution interconnects and a means for barrier, wherein the means for barrier is coupled to the interposer interconnect and a redistribution interconnect such that the means for barrier is located between the interposer interconnect and the redistribution interconnect; and
a first die coupled to the means for redistribution through the cavity of the means for substrate such that a region between the first die and the means for redistribution is free of an underfill, wherein the first die is coupled to the means for redistribution such that a front side of the first die faces the means for redistribution.

29. The apparatus of claim 28, further comprising an encapsulation layer over a backside of the first die, wherein the means for interposer is free of a metal ring that surrounds the first die.

* * * * *